US012651096B2

(12) United States Patent (10) Patent No.: US 12,651,096 B2
Malekian et al. (45) Date of Patent: Jun. 9, 2026

(54) AUGMENTECTURE SOFTWARE APPLICATION INCLUDING TEAM VIEWING

(71) Applicant: AUGmentecture, Inc., Montrose, CA (US)

(72) Inventors: Alen Malekian, Glendale, CA (US); Zarik Boghossian, Glendale, CA (US)

(73) Assignee: AUGMENTECTURE, INC., Montrose, CA (US)

( * ) Notice: Subject to any disclaimer, the term of this patent is extended or adjusted under 35 U.S.C. 154(b) by 869 days.

(21) Appl. No.: 17/897,197

(22) Filed: Aug. 28, 2022

(65) Prior Publication Data

US 2023/0068093 A1     Mar. 2, 2023

Related U.S. Application Data

(60) Provisional application No. 63/238,214, filed on Aug. 29, 2021.

(51) Int. Cl.
G06F 30/13 (2020.01)
(52) U.S. Cl.
CPC .................................. G06F 30/13 (2020.01)
(58) Field of Classification Search
CPC .......... G06F 30/00; G06F 30/13; G06F 30/12; G06F 2111/02

USPC ............................................................ 703/1
See application file for complete search history.

(56) References Cited

U.S. PATENT DOCUMENTS

2013/0144566 A1*  6/2013  De Biswas ............. G06F 30/00
                                                               703/1
2021/0026998 A1*  1/2021  Hoppe .................. H04L 65/403

* cited by examiner

*Primary Examiner* — Cedric Johnson

(57)     ABSTRACT

A method of team viewing of an architecture design model includes executing team viewing computer-readable instructions to initiate team viewing; attempting to enter a virtual room to allow for more than one user to view the three-dimensional (3D) architectural design model; joining the virtual room as a guest; and receiving identification data or parameters regarding the 3D architectural design model. If a user computing device and memory device already has an electronic copy of the 3D architectural design model, the 3D architectural design model is constructed and displayed in the virtual room. If a user computing device and memory device does not have the electronic copy of the 3D archi-tectural design model, the 3D architectural design model is downloaded to the user computing device and displayed on a surface and synchronized with a room creator of the virtual room.

8 Claims, 36 Drawing Sheets

205

Upload Completed

 No-reply
To: Alen Malekian

203

 If there are problems with how this message is displayed, click here to view it in web browser.

AUGmentecture

Document 944 AIRWAY has been updated and ready for processing.

Once it has been converted, you will receive another email letting you know if is ready to be viewed on the Aug Application Please do not replay to this email. For support, you can Contact Us.
©2020 Augmentecture Inc. All Rights Reserved.

FIG. 2D

Conversion Completed                                                      204
 No-reply
To: Alen Malekian
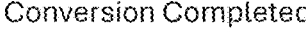 If there are problems with how this message is displayed, click here to view it in web browser.
AUGmentecture
Conversion of Document 944 AIRWAY has been completed.
Click Here to access the model number.
Please do not replay to this email. For support, you can Contact Us.
©2020 Augmentecture Inc. All Rights Reserved.
FIG. 2E

273

View of model
274

Augmentecture
Model: 54801_rac_basic_sample_project.obj
by alen@augmentecture.com Open in mobile application

1/1

278          279

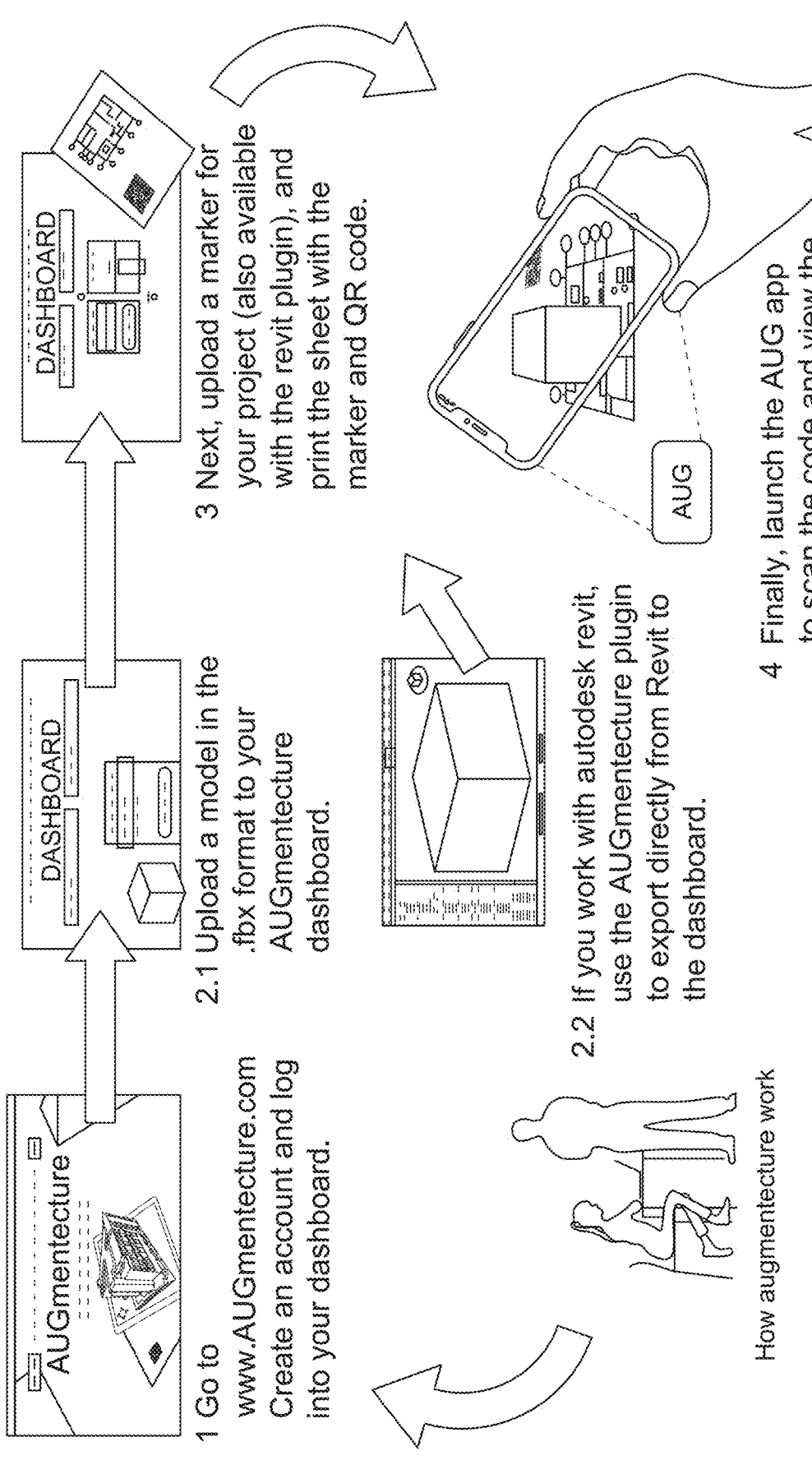

1 Go to www.AUGmentecture.com Create an account and log into your dashboard.

2.1 Upload a model in the .fbx format to your AUGmentecture dashboard.

2.2 If you work with autodesk revit, use the AUGmentecture plugin to export directly from Revit to the dashboard.

3 Next, upload a marker for your project (also available with the revit plugin), and print the sheet with the marker and QR code.

4 Finally, launch the AUG app to scan the code and view the model on your mobile device.

How augmentecture work

FIG. 2N

AUGmentecture™ Demo

1. Print this page.
2. Download the AUG app onto your device & launch it.
3. Point your device at the QR code.
4. View the model in Augmented Reality!

505

505

525

605

705

710

715

720

Lines drawn on image 1405
Figure
14A
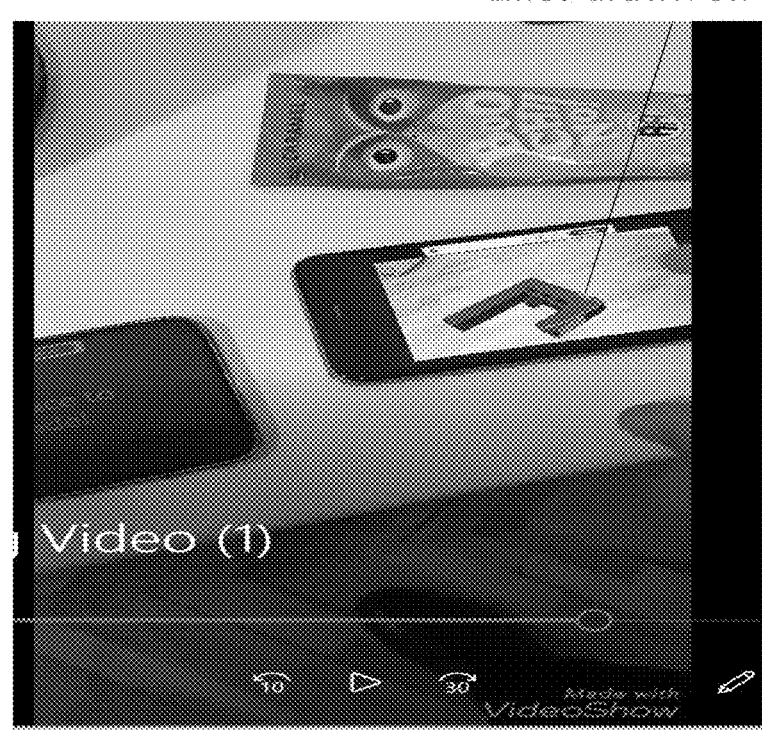
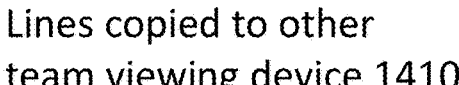
Lines copied to other
team viewing device 1410
Figure 14B

AUGMENTECTURE SOFTWARE APPLICATION INCLUDING TEAM VIEWING

RELATED APPLICATIONS

This application claims priority to and is related to provisional patent application Ser. 63/238,214, filed Aug. 29, 2022, entitled "Augmentecture Software Application Including Team Viewing," the entirety of which is incorporated herein by reference.

BACKGROUND

Architecture, Construction, Mechanical, Electrical and/or Plumbing Industries experience project delays due to errors and/or mistakes in many aspects of the process. Design information that a customer or designer believes is clear is not passed on or is passed on incorrectly to a next step in the building or design process and this leads to errors and/or mistakes. The costs of these errors is increasing which leads to overruns in construction and/or design budgets and/or therefore customer dissatisfaction. One possible solution is described below.

BRIEF DESCRIPTION OF THE DRAWINGS

FIG. 2D illustrates a menu or screen identifying that the initial design file has been uploaded to the AUGmentecture™ backend server computing device according to some embodiments;

FIG. 2E illustrates another message identifying the design file has been converted to an AR mobile design file according to some embodiments;

FIG. 2I below illustrates a view of the created AUG file according to some embodiments;

FIG. 2N, depicts AUGmentecture's unique workflow using Revit Plug-in or Direct upload from the desktop according to some embodiments;

FIG. 2O, depicts AUGmentecture's unique workflow using Sketchup Plug-in according to some embodiments;

FIG. 14A illustrates a user drawing lines or shapes utilizing a team viewing application according to some implementations; and FIG. 14B illustrates another user's computing device receiving and displaying the added drawing lines or shapes according to some implementations.

DETAILED DESCRIPTION

Figure 1:
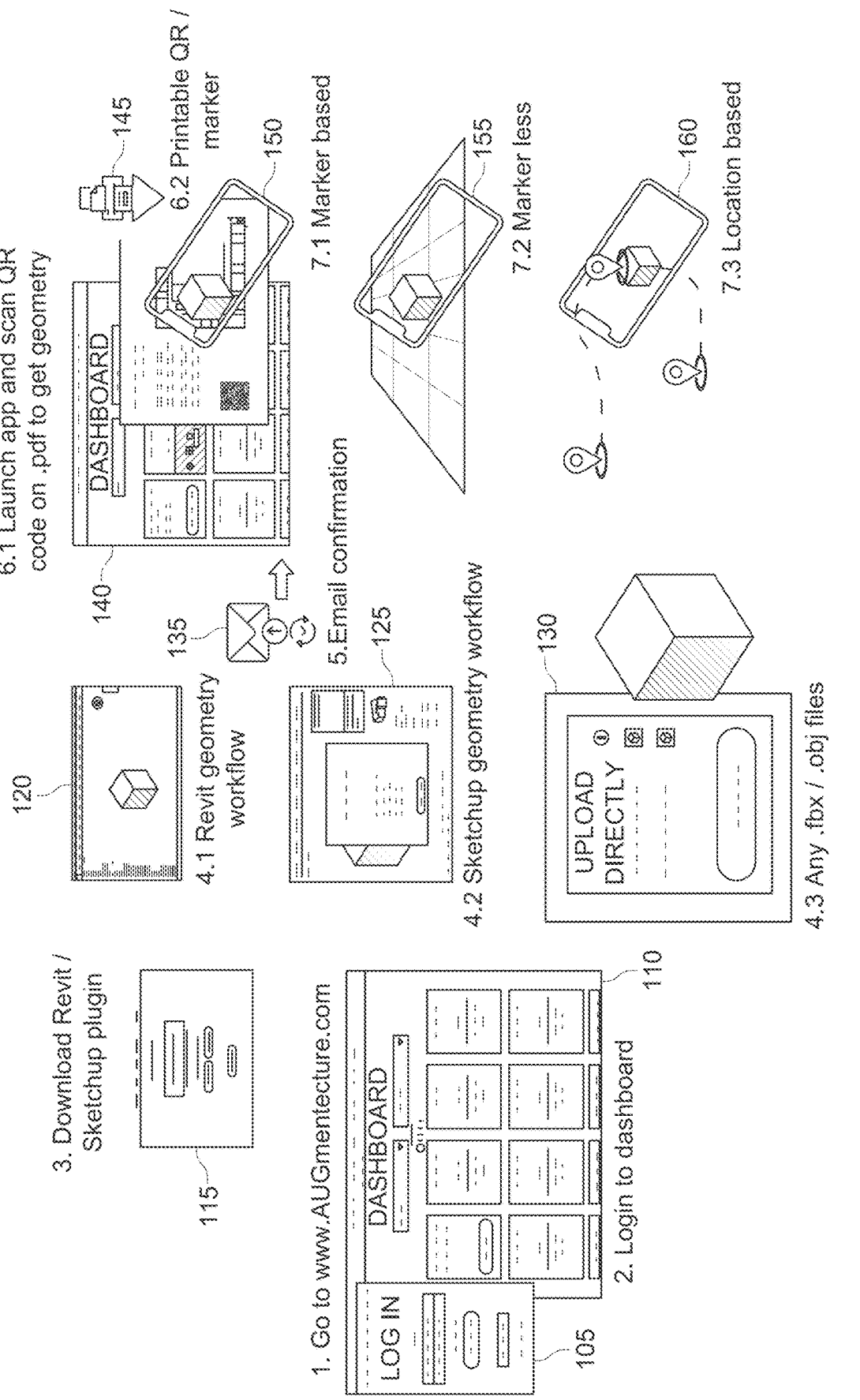
FIG. 1 illustrates an overview of a workflow for the cloud-based AUGmentecture™ system according to some embodiments.

The following detailed description and provides a better understanding of the features and advantages of the inventions described in the present disclosure in accordance with the embodiments disclosed herein. Although the detailed description includes many specific embodiments, these are provided by way of example only and should not be construed as limiting the scope of the inventions disclosed herein.

AUGmentecture™—A Unique Workflow in Augmented Reality for Design Collaboration. With the ever increasing cost of errors, mistakes, and project delays in Architecture, Construction, and Mechanical-Electrical-Plumbing (MEP) industries, AUGmentecture™ was created as a Software as a Service (SaaS) solution (e.g., or cloud-based software) in the Augmented Reality (AR) industry for communication and collaboration of design information in AR. The AUGmentecture™ SaaS solution goal is to make augmented reality a day-to-day design communication and collaboration tool for architects, designers, and/or artists.

In addition to creating a unique workflow converting these 3D design elements into a viewable AR experience on mobile communication devices, a new industry file format has been developed for communicating, transferring, transmitting and/or receiving AR-based or AR-related files. The new file format is a proprietary format and may be referred to as an AUG file format (or AUG format, AUG file, or proprietary format). Accordingly, architects, designers and/ or artists may exchange these AR files in AUG™ format. In some embodiments, each AUG file would have a secured and unique identifier, which may be a QR code. In some embodiments, every time an AUG file is created, a secured and unique identifier is created (even if associated with a 3D model file that already has an AUG file previously created). In some embodiments, each AUG file will also have another secured and unique identifier, which may be a logo, a design view or another image. These AUG files can then be attached and transferred or communicated via emails (or via other electronic messages using hyperlinks (e.g., a text message with a hyperlink to the AUG files)) to the end consumers or clients for communication or collaboration purposes (e.g., to view designs when the client's and designer/architects are not located in the same facility). In other words, utilizing communication and/or transferring of AUG files allows an end consumer or client to view a three-dimensional design view of a building, product, furniture or other items that have been designed without the need for the exchange of traditional paper blueprints, printed photos, or other costly means (which only provide a two-dimensional view of the designed building, product, furniture or other items). The inventors believe this is the "The Next Standard in Design & Information Communication Industry to Exchange Data in Augmented Reality Format." As an example, an AUG file may become so commonplace that it could be considered as prevalent in the design community as a pdf. In some embodiments, the AUG files and/or associated format may be seamlessly integrated with BIM (Building Information Modeling) technology. In other words, the BIM technology may easily add the AUG file to the existing technology.

The system solution described herein (which may be referred to as AUGmentecture's SaaS solution) is a cloud-based system and includes a) back-end server computing device technology and/or software; b) mobile communication device technology, hardware and/or software; and/or c) plug-in software for existing architecture and/or design software (such as Revit and/or Sketchup). These pieces include the following technologies and geometry visualization elements.

In some embodiments, the back-end server computing device technology and/or software comprises private and/or secured cloud-based server computing devices that house (or has installed thereon) multi-tenancy architecture software. In some embodiments, the architecture software (e.g., which includes AUGmentecture™ software) may include each customer's profile files and associated design model files. In some embodiments, the associated design model files may include the original design files, AR design files and/or AUG files). In some embodiments, the profile and associated design model files are privately stored and/or encrypted, which protects these design model files from loss of information and/or privacy breaches. In some embodiments, the backend server computing device technology and/or software may also include reduction processes or algorithms (e.g., computer-readable instructions executable by one or more processors) to initially compress these large size initial design model files (e.g., 3D model files) to compress design files and then convert the compressed design model files to the AR design file viewable via a number of computing devices. The initial design model files (e.g., 3D model files) may be huge high polygon count models. In addition, the backend server computing device technology and/or software may create an AUG file (or marker file) that includes a first marker (e.g., QR code) and/or a second or another marker (that may be utilized to orient a display of the 3D model).

In some embodiments, the mobile communication device technology may include mobile communication devices (e.g., smartphones, tablets, laptops, cellular phones) having one or more memory devices, and/or computer-readable instructions stored on the one or more memory devices that are executable by the one or more processors of the memory device to allow end users to view the designed elements or products in an augmented reality (AR) format. In some embodiments, the computer-readable instructions may be compatible with different platforms, such as the iOS platform and the Android platform, as well as a Microsoft-based mobile device platform (e.g., Windows Mobile).

In some embodiments, computer-readable instructions (e.g., software or the AUGmentecture™ software) may be available that is integratable with commercially available three-dimensional (3D) modeling or design tools. This integrated software may be referred to as plug-in software. In other words, if a user is accessing the design software (e.g., via a cloud-based solution or via desktop software), the AUGmentecture™ software may be downloaded or made accessible to the computing device which is executing the 3D modeling or design tool. In some embodiments, plugin software modules may be available for leading 3D modeling tools such as Revit and Sketchup. In some embodiments, these AUG plugins may allow the architects and designers the convenience of having an "AUG" tab integrated with their commercial 3D software products such as Revit and Sketchup. In some embodiments, by having the integrated "AUG" tab, the architects and/or designers may then easily export their 3D models (which are large files) and communicate and/or transfer these large files to AUGmentecture's secured backend server system for preparation of the "AUG" files and/or AR files. In some embodiments, at the AUGmentecture's secured backend server system, the 3D models are compressed and/or then converted into two different types of files. In some embodiments, one file may be viewable in a desktop computing device by the designer or architect via an AUGmentecture™ dashboard (which may be referred to as the desktop AR file). In some embodiments, an additional file may be generated (e.g., which may be referred to as the mobile AR file) that can be shared with end users, and viewable on the end users' mobile communication devices. This is a novel aspect of the system where two different types of files Accordingly, the AUGmentecture™ SaaS cloud-based system is practical, and easy to use. In some embodiments, the AUGmentecture system may be accessible either with or without a WiFi network because a design professional can send an email to a client. With the client's mobile communication device, the client can scan the QR code in the email or open the model in the AUGmentecture™ mobile application software. In some embodiments, after retrieval from the AUGmentecture™ SaaS cloud-based system, the mobile AR file may be stored in the one or more memory devices of the mobile communication device for future retrieval of the model (e.g., mobile AR file) even if there is no WiFi connectivity. In other words, once the mobile AR file has been opened in the mobile communication device, the mobile AR file may be loaded into the memory of the mobile communication device. This allows the mobile AR file to be accessed even if the client (and thus the client mobile communication device) does not have access to a wireless communication network (e.g., a WiFi network and/or a cellular data network. In some embodiments, the AUGmentecture™ system may be location aware, where an end user may actually walk to location where construction of a building or design element is being built or will be built, and may be able to view what the completed construction of the building or design element will be in an AR format (without having to utilize a marker). This will be explained later in detail and is another unique and novel aspect of the presently designed system.

FIG. 1 illustrates an overview of a workflow for the cloud-based AUGmentecture™ system according to some embodiments. In some embodiments, the AUGmentecture™ system may include an AUGmentecture™ web site 105, an AUGmentecture™ dashboard 110, AUGmentecture™ plug-in software 115, multiple workflow tools 120 125 or 130, the backend server including email configuration 135, a mobile device application 140, a printable QR/marker 145, a marker-based display module 150, a marker less based display module 155 and/or a location based display module 160.

In some embodiments, at workflow item 105, a design professional and/or architect may login to a website (e.g., an application server such as www.AUGmentecture.com) in order to initiate the process. In some embodiments, this might involve setting up an account and in other cases, the designer, engineer and/or architect may login to an existing account. In some embodiments, after login to his or her account, in workflow item 110, the application server software on the application server computing device may generate and display a dashboard user interface. In some embodiments, the dashboard user interface may provide an architect or other design professionals with multiple options for managing their existing initial design model files and/or to create new initial design model files. With respect to FIG. 1, the description below may be directed to the creating of the AR files (or proprietary design model files) and/or the marker file (e.g., the AUG file).

In some embodiments, initial design model files may be created utilizing a commercial design program or application (e.g., Revit and/or Sketchup). In such embodiments, in workflow item 115, a designer, engineer and/or architect may download a commercial design software plugin to their browser. As mentioned previously, this may be a Revit and/or Sketchup plugin (although other commercial design software plugins may also be utilized). In some embodiments, the designer, engineer and/or architect may then create the initial design file or initial geometry file for the proposed product or building design.

In some embodiments, in workflow item 120, Revit may utilize the Revit geometry workflow to create the initial design file or initial geometry file. In some embodiments, in workflow item 125, Sketchup may utilized the Sketchup geometry workflow to create the initial design file or initial geometry file. In some embodiments, in step 130, the initial design file (3D model file) or the geometry file may already exist and may be accessed via the dashboard of the AUG software. In some embodiments, these initial design files or geometry files may be object design files (e.g., .obj files). This is also a unique feature because the cloud-based AUGmentecture™ system allows three different ways to receive the initial design files or geometry files into backend processing server computing device.

In some embodiments, as will be described in detail below, the initial design files or geometry files (3D files) described above (generated in workflow items 120, 125 and/or 130) may be received by a backend processing server computing device and may be compressed to minimize the size of the initial design file and/or initial geometry files and then may be converted to an AR design file (or desktop AR file), which may be viewable by the architect, engineer or designer via the AUGmentecture™ software accessible via the AUGmentecture software dashboard. In some embodiments, the initial design file or geometry file (e.g., 3D model files) may also be converted into AR mobile design file, which may be viewable by a client via a mobile communication device. After the processing has been completed, the AR design file, and the AR mobile design file may be stored in one or more memory devices of the backend processing server computing device. In some embodiments, in workflow item 135, the backend processing server (or the AUGmentecture application server) may communicate an electronic message (e.g., an email, text message, etc.) to the designer or architect via a specified computing device that the conversion is complete.

In some embodiments, the backend processing software and/or application server software may create a first marker (e.g., which may be a QR code) to be associated with the mobile AR file (and/or the desktop AR file) which may be part of an AUG file that is also generated by the backend processing software and/or application server software. In some embodiments, an architect, engineer or designer utilizing the backend processing server and/or the application server (and the software stored therein) may generate an additional marker file (or second marker file), which may be a logo, a 2D view of the design associated with the 3D model file and/or another image selected by the design professional. In some embodiments, the AUG file may include the first marker and/or the additional marker. In some embodiments, in workflow item 145, an architect, engineer or designer may print the AUG file utilizing the backend server system and/or the application server, and the AUG file may include the marker and/or the additional marker printed thereon. In some embodiments, an architect, engineer or designer may create an AUG .pdf file with the marker and/or the additional marker embedded therein. In some embodiments, the AUG .pdf file may be stored in one or more memory devices of the server computing devices (e.g., the backend server system and/or the application server).

In some embodiments, the designer, engineer or the architect may provide the printed AUG file to the client or customer where the printed AUG file may include the two markers discussed above. In some embodiments, in addition to and/or as an alternative to the item described above, the designer, engineer or architect may communicate an AUG .pdf file to the client or customer via electronic communications, where the AUG .pdf file to the client or customer.

In some embodiments, a prospective consumer, client or user may have a mobile computing device (or other computing device). In some embodiments, in workflow item 140, the client or user may download the AUGmentecture™ mobile software application to the mobile computing device and may launch or initiate the AUGmentecture™ mobile software application on the mobile communication device.

In some embodiments, now that all of the processing of the initial 3D design file is completed by the AUGmentecture™ backend processing server, a customer or user may be able to view the AR mobile design file via a number of different methods. There are no other known architecture, AR software programs and/or systems that are provide this functionality and/or different modes of operation to allow viewing of the AR mobile design files. In some embodiments, the user, client or customer may be able to view the AR mobile design file via a marker-based viewing process; a marker-less viewing process and/or a location-based viewing process. In some embodiments, in workflow item 150, a client, user or customer may have a printed copy of the design file with at least one marker printed thereon (e.g., a QR code and/or a second marker). In some embodiments, the user, client or customer may turn on an imaging device of the mobile communication device and may scan and/or capture the initial or first marker (e.g., the QR code) on the printed copy of the design file. In some embodiments, the mobile communication device may then receive and/or retrieve the mobile AR design file from the backend processing server device (e.g., the AUGmentecture server computing device device), download the mobile AR design file to the mobile communication device and display the AR mobile design file on a screen or display of the mobile communication device. In some embodiments, the second marker may be captured from the printed design file and the second marker may identify a view, an orientation and/or parameters of the AR mobile design file.

In some embodiments, in workflow item 155, a client, user or customer may utilize a marker-less process to be able to display an image of the associated design with AR content (e.g., the mobile AR design file) on a screen of the mobile communication device. In some embodiments, the marker less process may use a surface mode feature (e.g., which may be available in the iOS and/or Android operating systems). In this embodiment, the user of the mobile communication device may identify a flat surface. In this embodiment, once the flat surface has been identified by the camera or imaging device of the mobile communication device, the mobile communication device may retrieve and/or download the mobile AR design file to the mobile communication device). Thus, the user may use the coordinates for navigation and user experience perspective. In other words, the surface mode gives us the ability not to have a marker for the camera to point at in order to receive or retrieve the mobile AR design file and display the mobile AR design file on the screen of the mobile communication device. In some embodiments, in workflow item 160, a location-based process may utilize geolocation in order to download orient and display the AR mobile design file on the mobile communication device. In some embodiments, when the AR mobile design file is being created, a geolocation mode may be set or initiated where the designer, engineer and/or architect may input the proposed coordinates of where the building and/or design element will be located and/or position. In some embodiments, the geolocation coordinates may be part of the AUG file, the AR mobile design file and/or the desktop AR design file. In some embodiments, the geolocation mode may be set after the initial design file has been received and/or created. In some embodiments, the geolocation coordinates may be transferred to the mobile communication device when the AR mobile design file is retrieved and/or downloaded and received. In some embodiments, the geolocation coordinates may be GPS coordinates or other map coordinates or measurements. In some embodiments, the user, client and/or customer may launch the AUGmentecture™ application software on the mobile communication and may initiate a geolocation mode. In some embodiments, as the user moves closer to the actual geographical coordinates associated with and/or embedded within the AR mobile design file, the mobile AUGmentecture™ software application may provide messages and/or non-verbal displays (e.g., a compass icon) to the user, customer and/or client to move to the desired location and/or position. In some embodiments, once the user, client or customer reaches the desired geographical location and/or position, the AUGmentecture™ software application may display the AR mobile design file on the screen on the mobile communication device.

Use Case #1. FIGS. 2A-20 illustrates a use case for using the AUGmentecture™ software when sharing a design of a 3-story office building with a client. In some embodiments, a client may contract an architect to design a 3-story building. In preparation for a first milestone meeting with a client, an architect or designer may present the progress of the 3-story office building to its client in an Augmented Reality (AR) format (e.g., the AUGmentecture AR mobile design file).

In some embodiments, an architect, designer and/or engineer may use Revit by Autodesk to drive efficiency and/or accuracy across the building project lifecycle, from conceptual design, visualization and analysis to fabrication and construction. In some embodiments, as a seamless integration of the Revit concept, the AUGmentecture system (or SaaS solution) may achieve this goal for clients. In some embodiments, a client may initially install a plugin software developed by AUGmentecture™ into the commercial design software (e.g., in this case Revit). In some embodiments, the installation of the plug-in software may automatically create a tab named "AUGmentecture" in the Revit application software on the engineer's and/or designer's desktop.

Now that the environment is setup and ready, the architect may create and complete the 3D model of the building or design element. In some embodiments, this may be referred to as the initial design file. In some embodiments, the initial design file may be an .OBJ formatted file. In some embodiments, the dashboard of the AUGmentecture software application on the desktop computing device of the designer, engineer or architect may include functionality to allow a designer, engineer and/or architect to upload the initial design file to the AUGmentecture backend server computing device. This is unique and not offered by any other AR-related design program. In some embodiments, the initial design file may be communicated, uploaded and/or transferred to the AUGmentecture™ backend server computing device. In some embodiments, the designer, engineer or architect may select the AUGmentecture' tab on the desktop design software and may automatically upload the initial design file (e.g., the 3D file in .OBJ format) to AUGmentecture's backend server computing device. In some embodiments, the AUGmentecture™ software on the backend server computing device may compress and convert the initial design file into an AR proprietary formats (e.g., one file of which may be viewable on the desktop computing device and one file which may be viewable on the mobile communication device). This is a critical step where the integrity of the initial design file (e.g., 3D model) is preserved to make sure that the end client is viewing a 3D model (via the AR mobile design file) that is similar to the model on the Revit software.

Figure 2A:
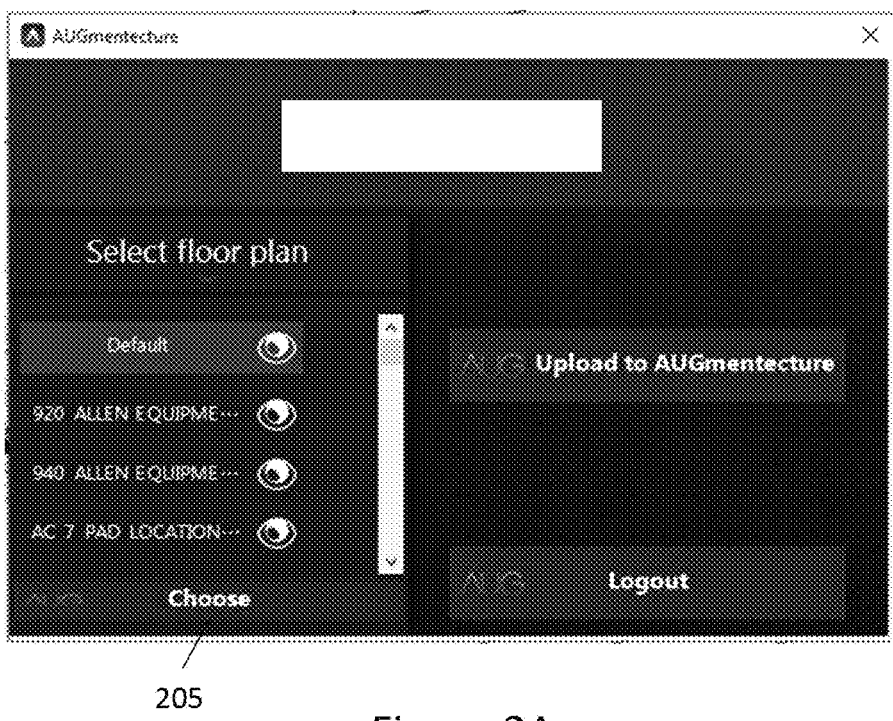
FIG. 2A illustrates a menu for selecting a floor plan to upload to the initial design file to the AUGmentecture™ backend server computing device according to some embodiments.

As an illustrative example of the AUGmentecture™ workflow process, a designer, engineer and/or architect may select an AUGmentecture tab while viewing a design element or building in a 3D view format in commercial design software. In some embodiments, a designer or architect may see a dialog box of the AUGmentecture™ software (e.g., after selecting the AUG tab) similar to FIG. 2A below and may select a desired view to be used as the 3D model file for exporting (e.g., by selecting the Upload to AUGmentecture icon or button). FIG. 2A illustrates a menu for selecting a floor plan to upload to the initial design file to the AUGmentecture™ backend server computing device according to some embodiments. In some embodiments, a design professional may utilize the "Choose" icon or button 205 to upload the initial design file.

Figure 2B:
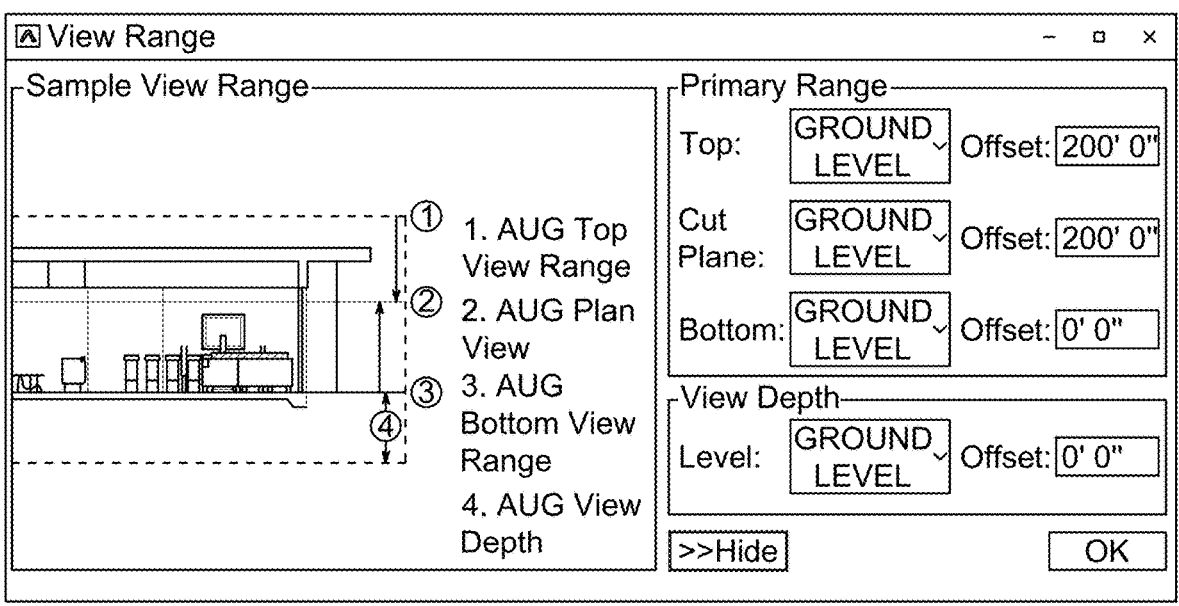
FIG. 2B below shows selection of the view range of a marker for an AUG file accordingly to some embodiments.

In a next step, after a floor plan or view is selected utilizing the "Choose" icon or button, an additional marker may be selected for exporting purposes. In some embodiments, the designer or architect may select a view range such as shown below for the AUG file. FIG. 2B below shows selection of the view range 201 of a second marker for an AUG file accordingly to some embodiments. This selection allows the proper augmented model experience.

Figure 2C:
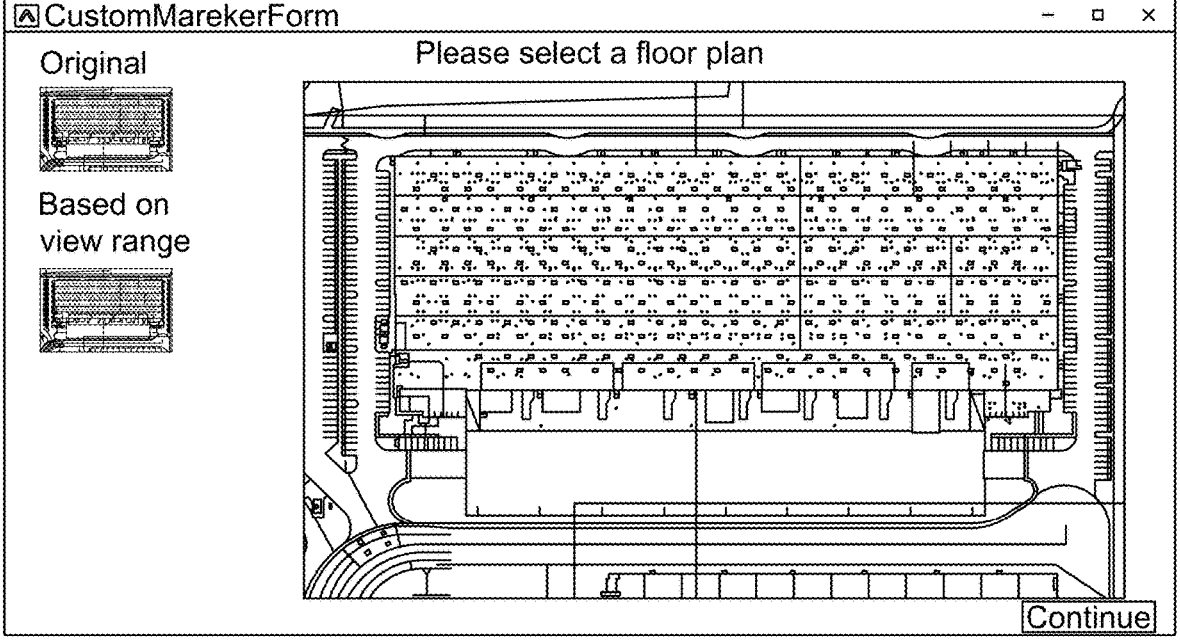
FIG. 2C illustrates a selection of a floor plan as an additional marker according to some embodiments.
Figure 2C:
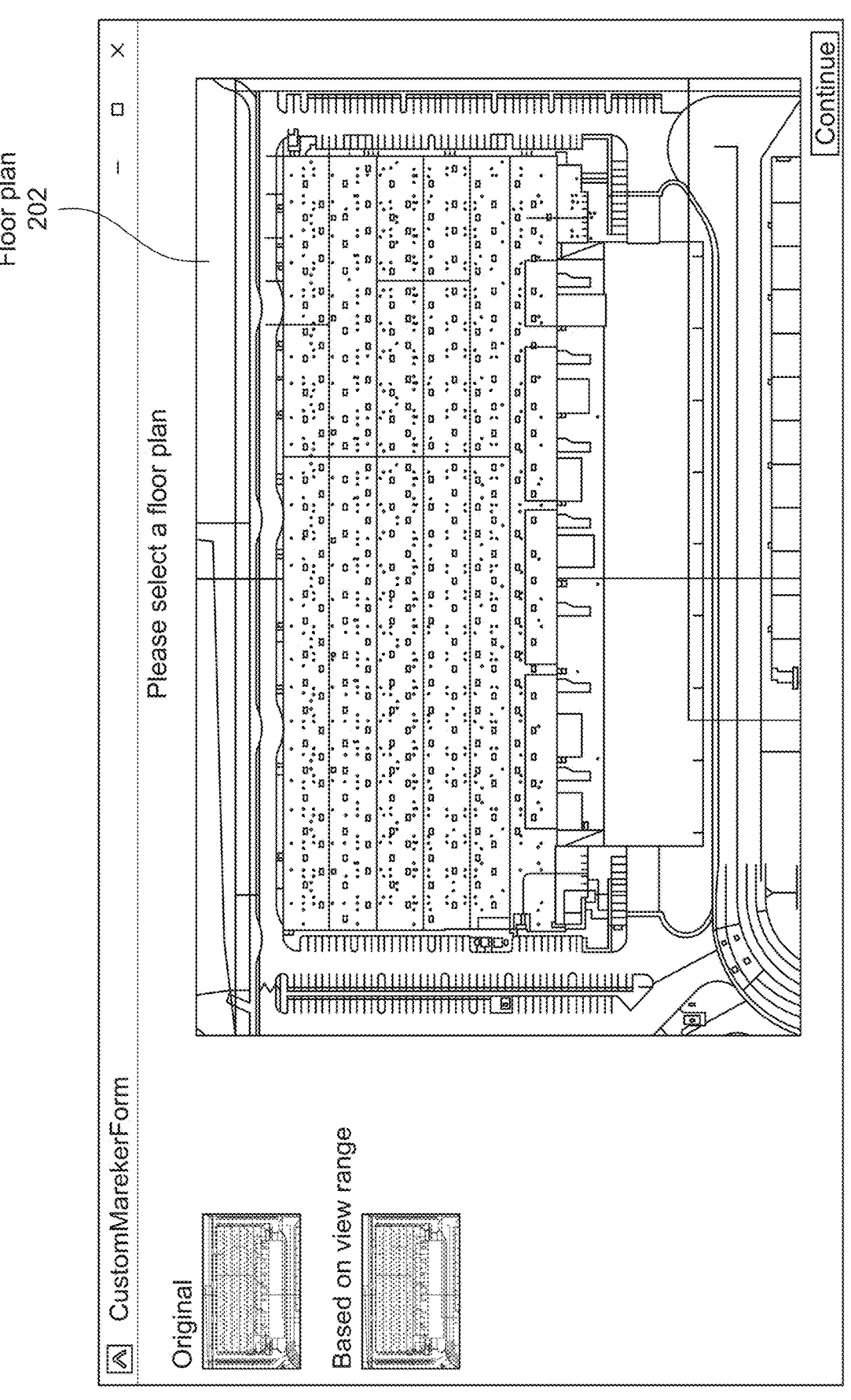

As an example, in some embodiments, a designer, engineer or architect may select a marker and/or a use of a marker on a two-dimensional floor plan (e.g., like a blueprint). The actual floor plan may be selected as the base marker or additional marker or may customize and select an additional marker for a printed floor plan. This is the marker to be utilized and/or captured by the AUGmentecture™ application software on the mobile communication device to provide orientation and/or proper viewing parameters of the AR mobile design file. FIG. 2C illustrates a selection of a floor plan 202 as an additional marker according to some embodiments.

In some embodiments, the AUGmentecture™ software on the backend processing server computing device may compress and convert the imported initial design file into an AR desktop design file in a proprietary format. In some embodiments, the AUGmentecture software on the backend processing server computing device may compress and/or convert the initial design file into a separate AR mobile design file. In some embodiments, upon completion of this workflow by the software on the AUGmentecture's backend server computing device, the backend server computing device software may automatically generate an email (or other electronic message) and the generated email to the architect confirming the model is now ready to be viewed in an Augmented Reality format by the client (e.g., the AR design file has been generated) and/or via the desktop computing device.

In some embodiments, the AUGmentecture™ software executing on the backend server computing device may generate a Unique Identifier or marker (which may be in the form of a QR code). In some embodiments, AUGmentecture™ software executing on the backend server computing device may associate this first marker or QR code with the previously created additional marker. The initial marker (e.g., QR code) and the additional marker may allow the AR mobile design file to be viewed properly on a mobile communication device. In some embodiments, the AUGmentecture™ software on the backend server computing device may create a proprietary file (e.g., the AUG file) that includes the first marker (e.g., QR code) and/or the additional marker.

In some embodiments, the figures below may identify the notification process involved in communicating with the client and/or the design professional. In some embodiments, a first notification to client may be that the upload is completed and may look like FIG. 2D below. FIG. 2D illustrates a menu or screen 203 identifying that the initial design file has been uploaded to the AUGmentecture™ backend server computing device according to some embodiments.

FIG. 2E illustrates another message 204 identifying the initial design file has been converted to an AR mobile design file according to some embodiments. In some embodiments, a second email (or other electronic message) may identify that the conversion has been completed.

Figure 2F:
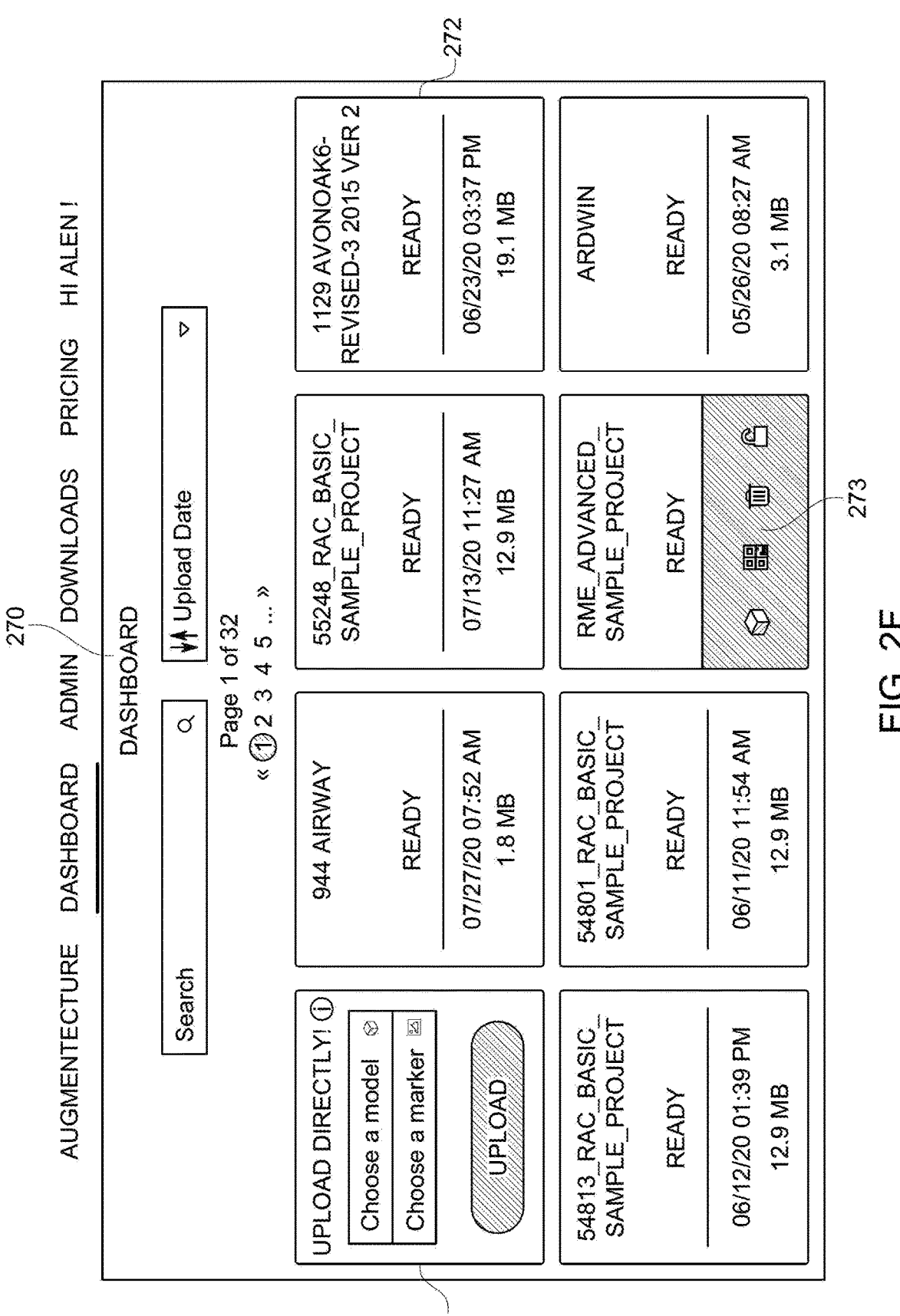
FIG. 2F below shows multiple converted design files being ready to be utilized by the designer or architect according to some embodiments.

FIG. 2F illustrates utilization of the personal dashboard online at for example a desktop computing device. In some embodiments, the client or consumer would select a file name (which shows that the AR mobile design file and/or the .AUG file have been created and are ready. FIG. 2F illustrates an AUGmentecture™ dashboard 275 including an upload menu or directory 271 and converted design files 272 and 273. Design file 273 has been selected by the AUGmentecture user and multiple options may be available to be utilized by the user. FIG. 2F below shows multiple converted design files being ready to be utilized by the designer or architect according to some embodiments. Specifically, RME_Advanced_Sample_Project (design file 273) illustrates icons or buttons available as a next step.

Figure 2G:
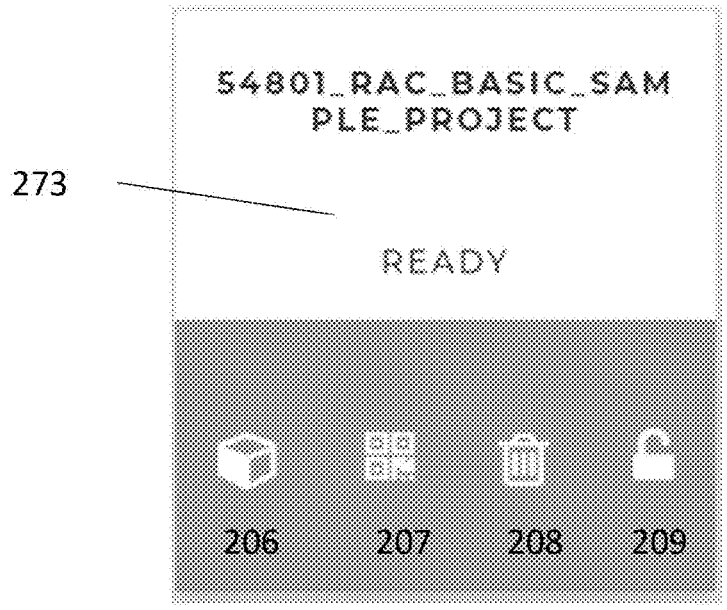
FIG. 2G illustrates options available for each model within the AUGmentecture™ backend processing system according to some embodiments.
Figure 2H:
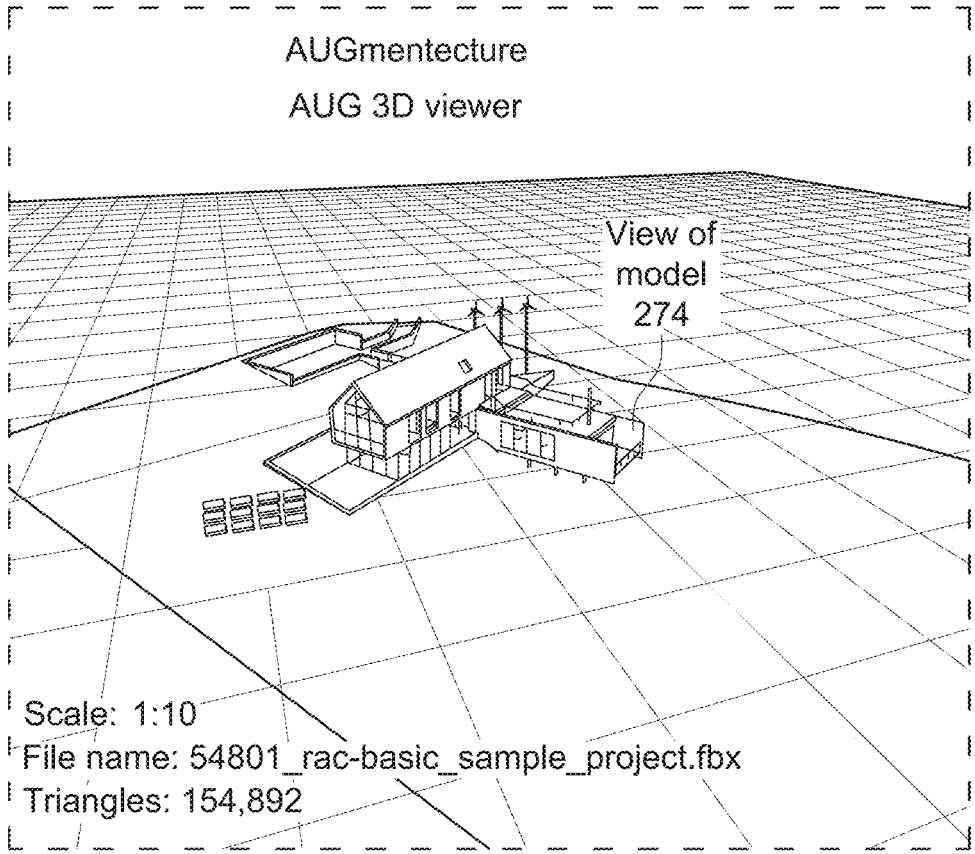
FIG. 2H which illustrates a view of the AR desktop design file on a desktop screen according to some embodiments.
Figure 21:
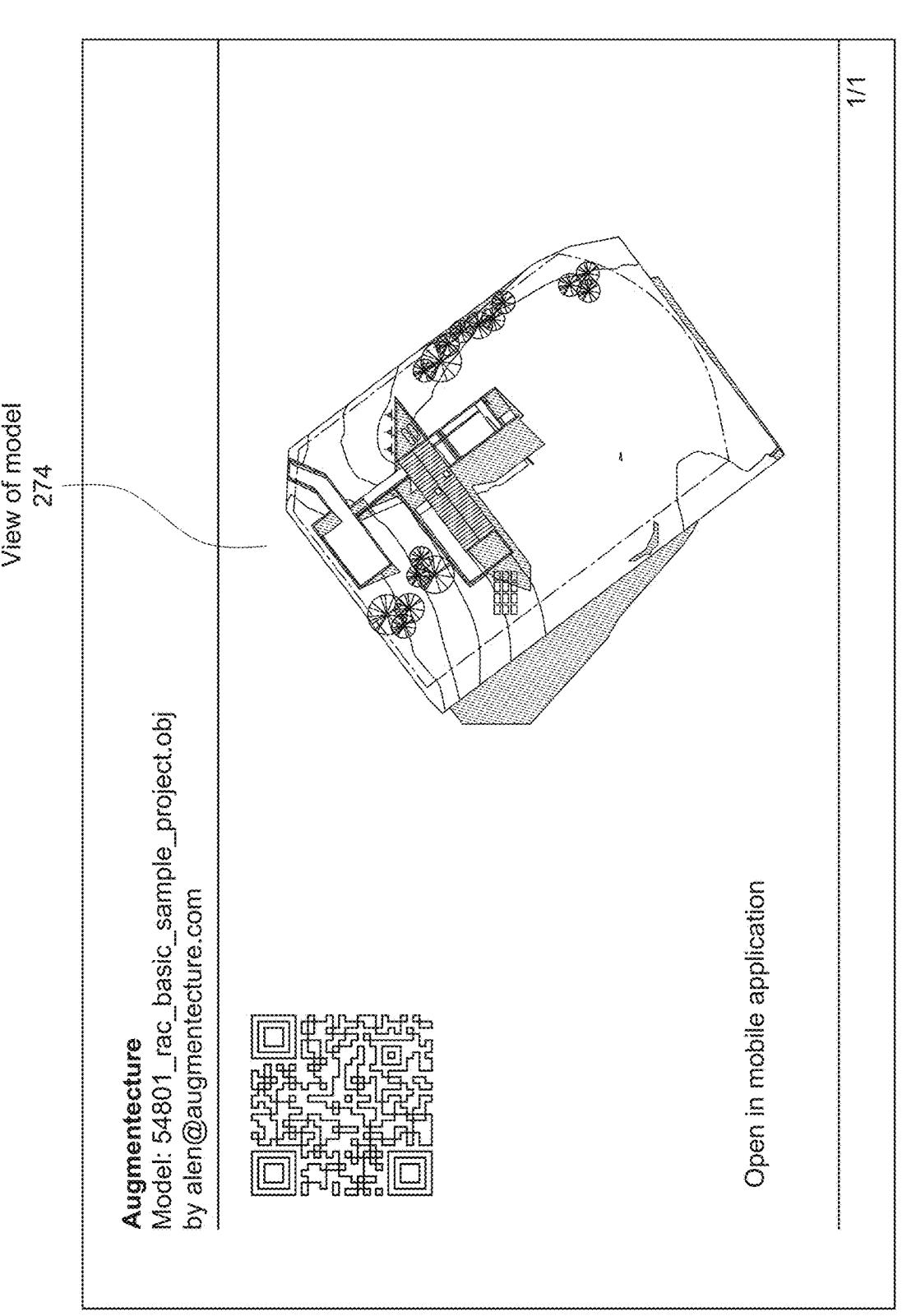

FIG. 2G illustrates options available for each model within the AUGmentecture™ backend processing system according to some embodiments. As illustrated in FIG. 2G below, within the dashboard, various other options may be available for each model (or converted initial design file) (e.g., file S4801 RAC BASIC SAMPLE PROJECT 273) such as; view model from AR desktop design file on desktop computer screen for verification of the end converted model 206; downloading and/or emailing the AUG file 207; deleting the AR desktop design file 208; or locking the file associated with the AR desktop design file 209.

In some embodiments, if a designer or architect selects the Augmented Reality View on a desktop Computer Screen (e.g., viewing of the AR desktop design file 206), the following screen may appear (e.g., FIG. 2H which illustrates a view of the AR desktop design file 274 on a desktop screen according to some embodiments):

FIG. 2I illustrates a view of the created AUG file according to some embodiments. In some embodiments, if a designer or architect selects View of AUG file 275 as appears on dashboard, the following screen or menu may appear.

Figure 2J:
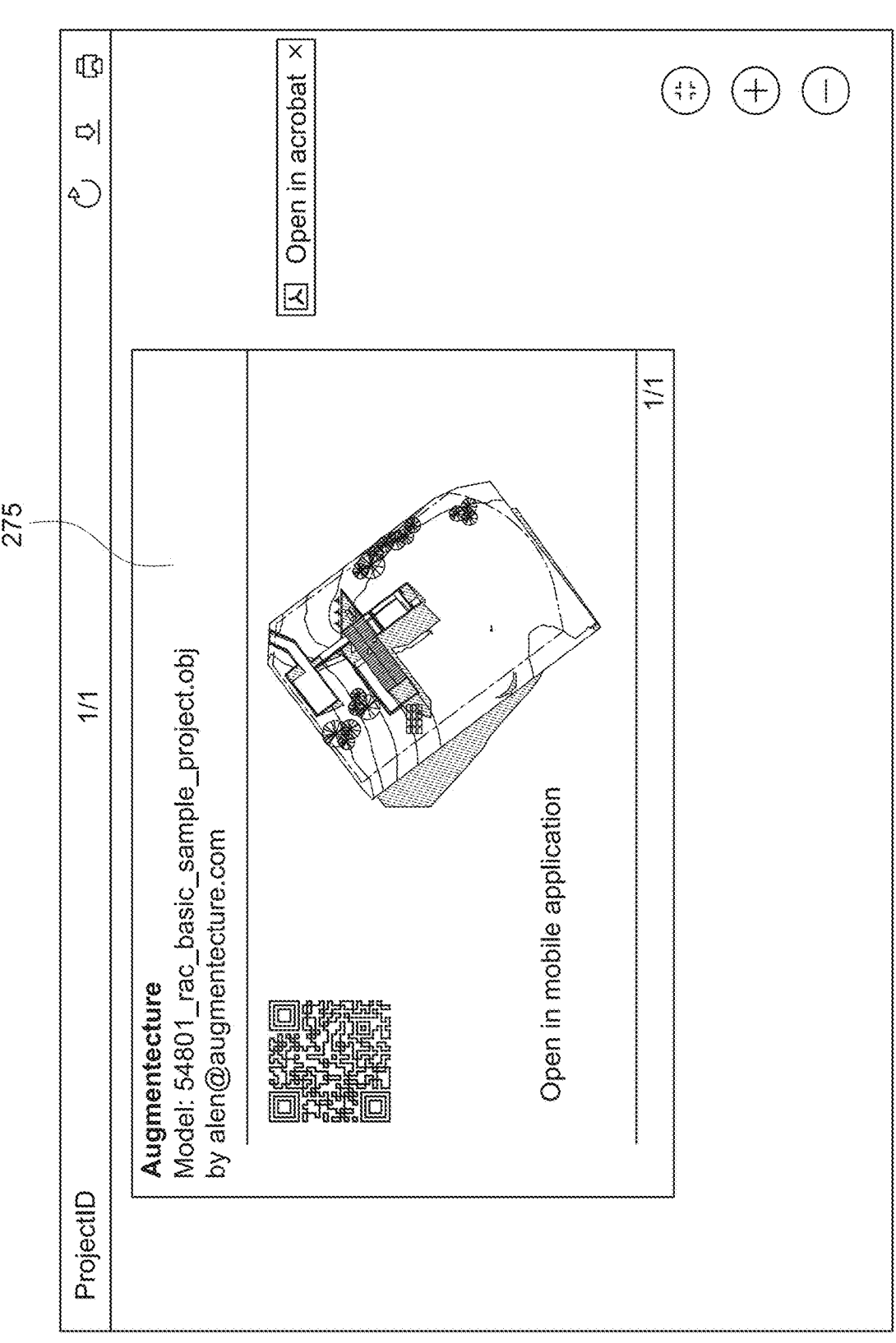
FIG. 2J illustrates a AUG pdf file according to some embodiments.

FIG. 2J illustrates a AUG pdf file according to some embodiments. In some embodiments, the architect may export the AUG file as PDF (as shown by reference number 276 in FIG. 2J below.

Figure 2K:
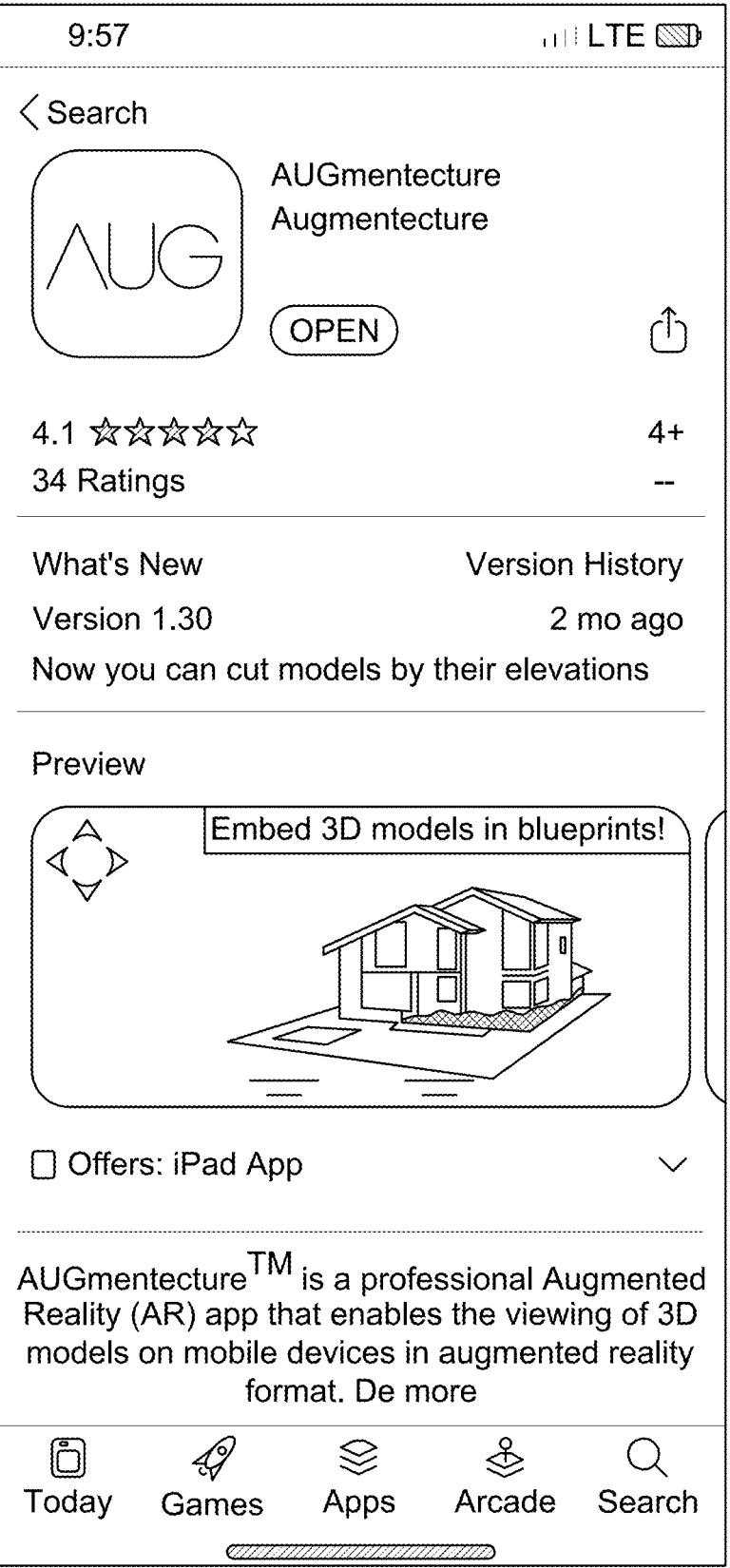
FIG. 2K illustrates the downloading the proprietary AR design software application in iOS according to some embodiments.

In some embodiments, a designer or architect may request the client or consumer to download the AUGmentecture™ software app (or proprietary software application) either in the iOS, Android or Windows (or other mobile communication device OS) version to the client or consumer's mobile communication device. FIG. 2K illustrates the downloading the proprietary AR design software application 276 in iOS according to some embodiments.

Figure 2L:
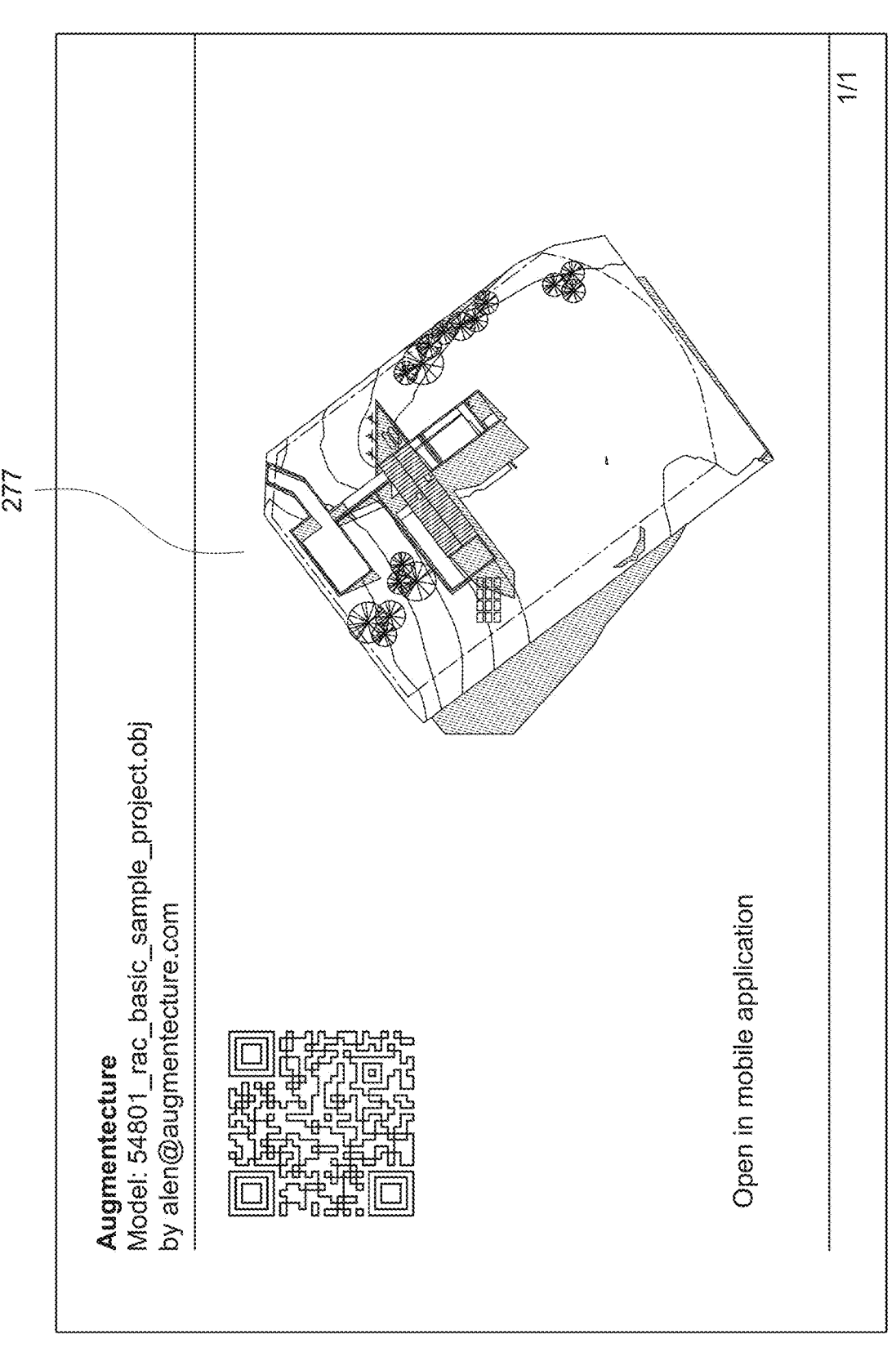
FIG. 2L below illustrates the attached AUG design file according to some embodiments.

In some embodiments, if using the marker-based process, the designer or Architect may send a private email to the client or consumer with an attached AUG file. FIG. 2L below illustrates the attached AUG design file 277 according to some embodiments. In some embodiments, the AUG file contains the QR code and/or the second or additional marker.

Figure 2M:
FIG. 2M illustrates a screen in the AR application software where the consumer or client selects to scan a new model according to some embodiments.
Figure 20:
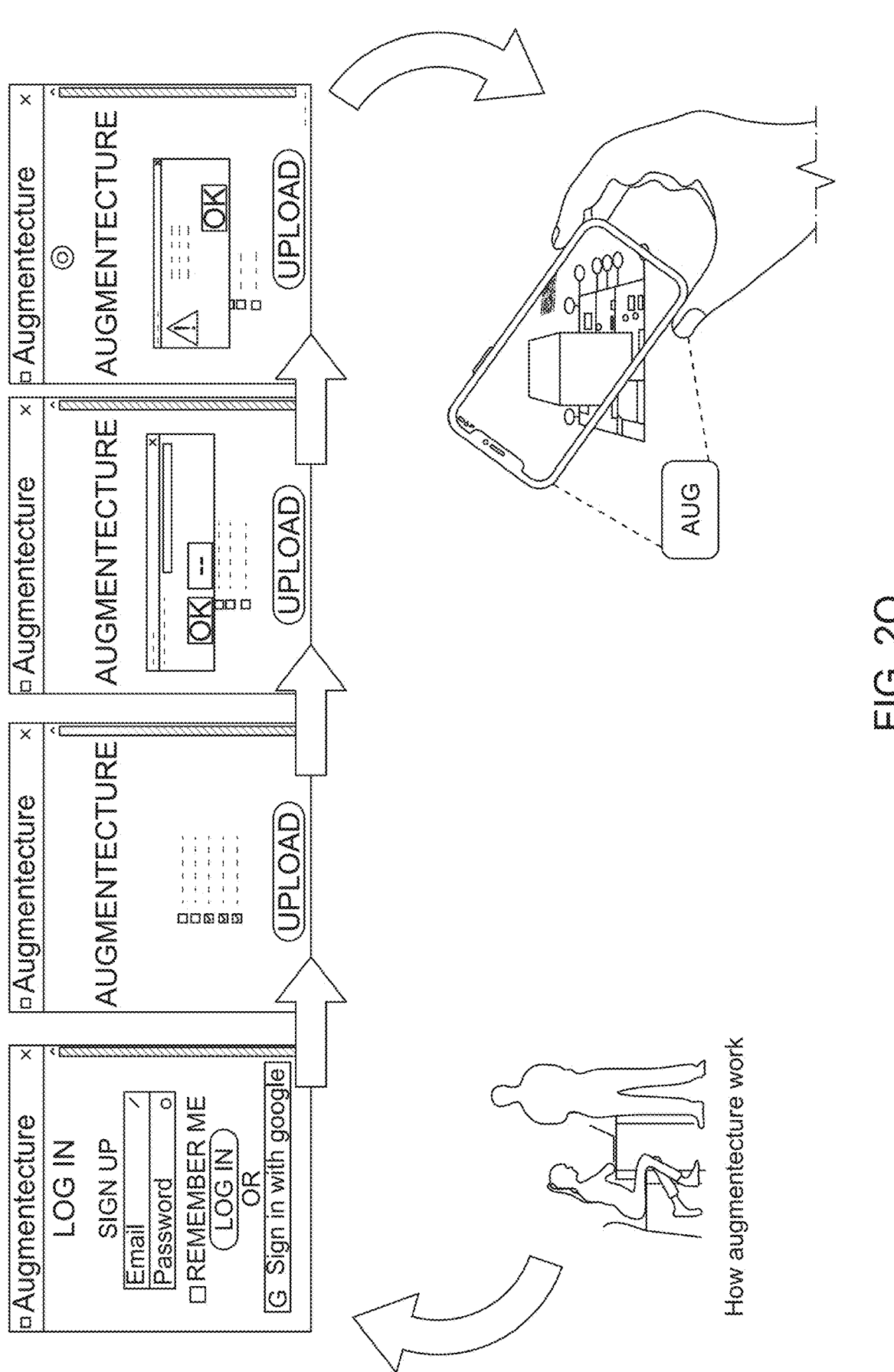

At this time, the client may be able to use the proprietary Augmented Reality application software (e.g., the AUGmentecture™ software app) on his mobile communication device to scan the QR code on the attached AUG design file (which was either printed or being displayed in pdf format). FIG. 2M illustrates a screen in the AR application software where the consumer or client selects to scan a new model 278 or select an existing model 279 according to some embodiments.

In some embodiments, scanning of the QR code may initiate downloading the AR mobile design file from the AUGmentecture™ backend server computing device into one or more memory devices of the mobile communication device. In some embodiments, the proprietary AR application software may display a progress bar or icon to show the progression of the download. In some embodiments, the client or user may then point the camera or imaging device onto the additional marker, which allows the user or consumer to view the AR mobile design file on the display or screen of the mobile computing device.

The diagram below, FIG. 2N, depicts AUGmentecture's unique workflow using Revit Plug-in or Direct upload from the desktop according to some embodiments.

The diagram below, FIG. 2O, depicts AUGmentecture's unique workflow using Sketchup Plug-in according to some embodiments.

Figure 2P:
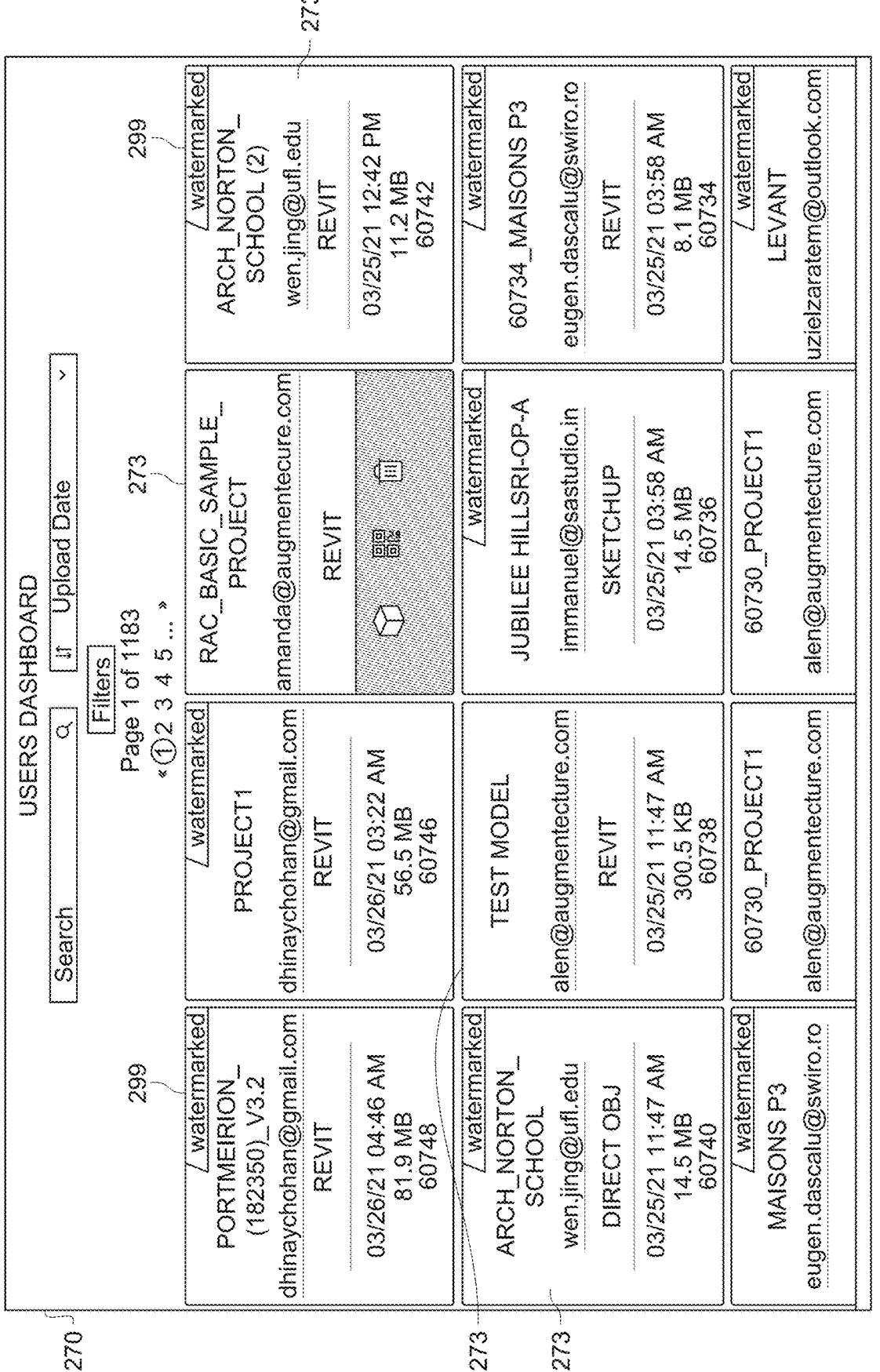
FIG. 2P illustrates an additional feature of the AUGmentecture's dashboard 270 according to embodiments.

FIG. 2P illustrates an additional feature of the AUGmentecture™ dashboard 270 according to embodiments. In FIG. 2P, on the AUGmentecture™ dashboard 270, files representing models may include a tag identifying the files may have watermarks. Reference number 299 illustrates a watermarked tag on one or more of the files or models 272. In some embodiment, a watermarked tag may identify that the file with the watermark tag 299 may have a watermark embedded when the file is displayed whether on the desktop computer and/or the mobile communication device. In some embodiments, a customer or user may request that the watermark be removed from the models or files in order to obtain a higher quality or resolution image.

Figure 2Q:
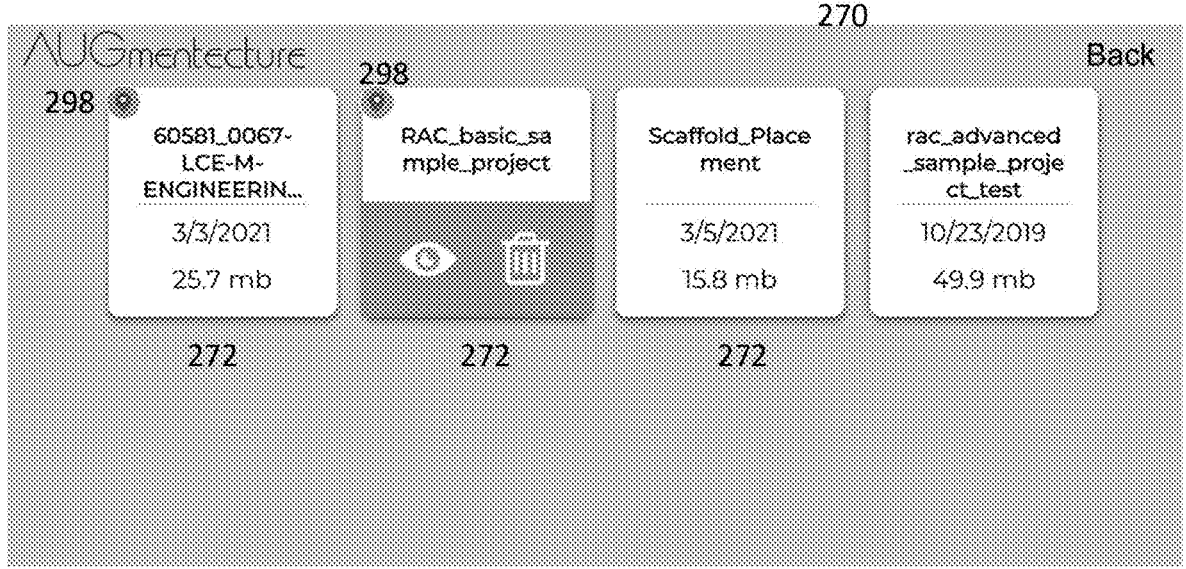
FIG. 2Q illustrates an AUGmentecture™ file 272 with a geolocation marker 298 according to some embodiments.
Figure 2R:
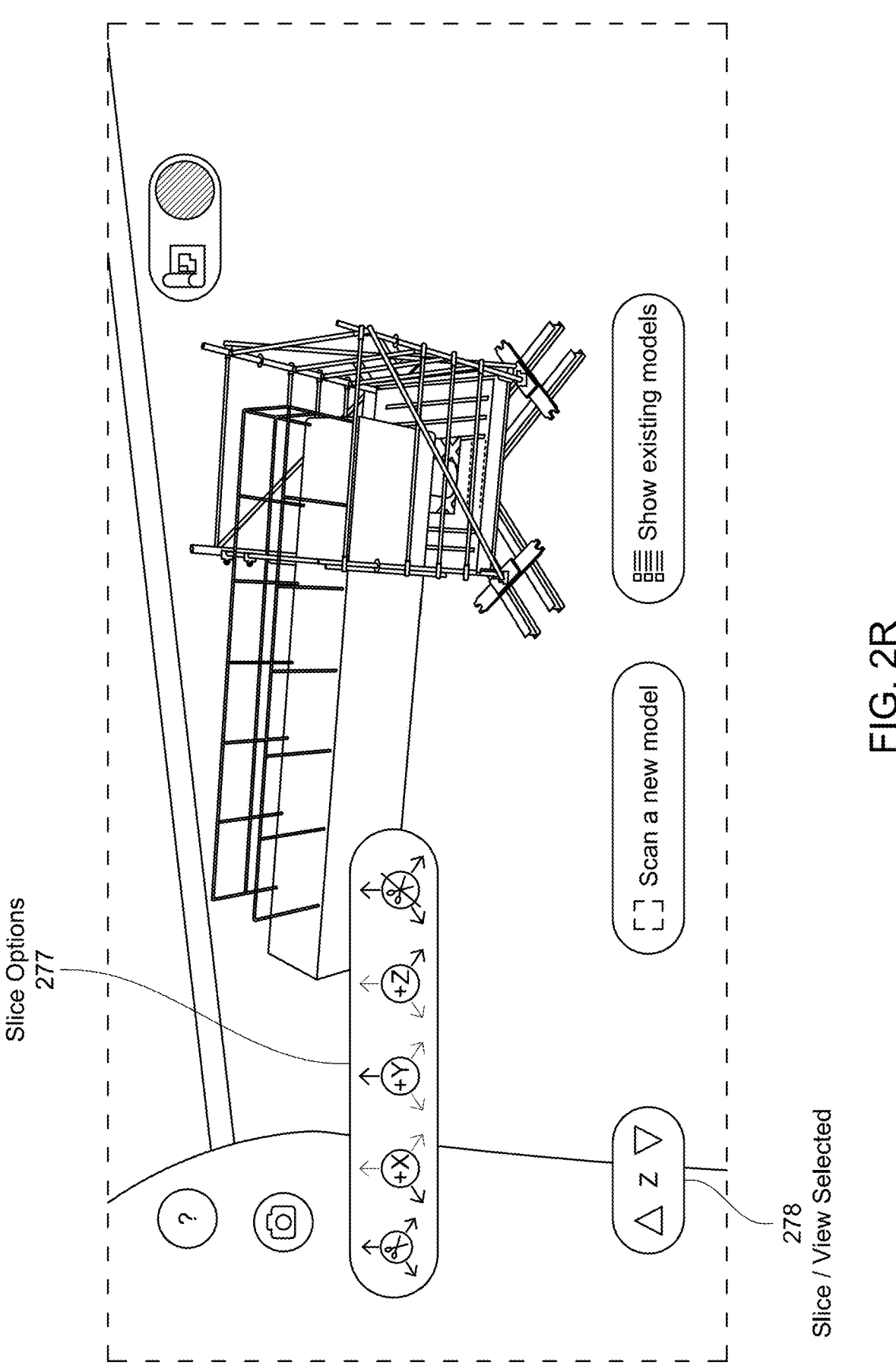
FIG. 2R illustrates a slicing feature of the AUGmentecture™ software application according to some embodiments.

FIG. 2R illustrates a slicing feature of the AUGmentecture™ software application according to some embodiments. In some embodiments, a menu of the AUGmentecture™ software application may allow a user to view different slices or portions of the files or models (e.g., three dimensional views of the models). Reference number 291 of the AUGmentecture™ software application allows a design professional to select different slices or views according to the x, y and z planes. Reference number 292 of the AUGmentecture™ software application shows which view or slice is being utilized or selected. Once a dimension is selected by the design professional, a bar will appear below reference number 291 with a pair of scissors and as the design professional moves from left to right along the bar, the 3-dimensional view of the model will be altered in that dimension or plane. As an example, if a z dimension is selected, as the scissors are moved left to right, a smaller height portion of the 3-dimensional view of the model may be displayed. In other words, the AUGmentecture™ software application is displaying only a portion that the design professional has selected (e.g., if the scissors are halfway across the bar, then only 50 percent of the 3-dimensional view of the model is shown. This is a unique feature that allows design professionals to view different slices of the design.

Use Case #2: In some embodiments, an AUG file may include of a first marker (a QR code) and an additional Marker. In some embodiments, the additional marker may be in a form of a typical blueprint, of a branding for the company (e.g., a logo), or any other relevant images. In some embodiments, the camera or the imaging device in the mobile communication device may utilize this additional marker for creating proper coordinates and/or parameters for the viewing experience of the AR mobile design file.

Figure 3A:
FIG. 3A illustrates where the AUG file may include a "Blueprint Marker" as the additional marker and a QR code as a first marker or initial marker.
Figure 3B:
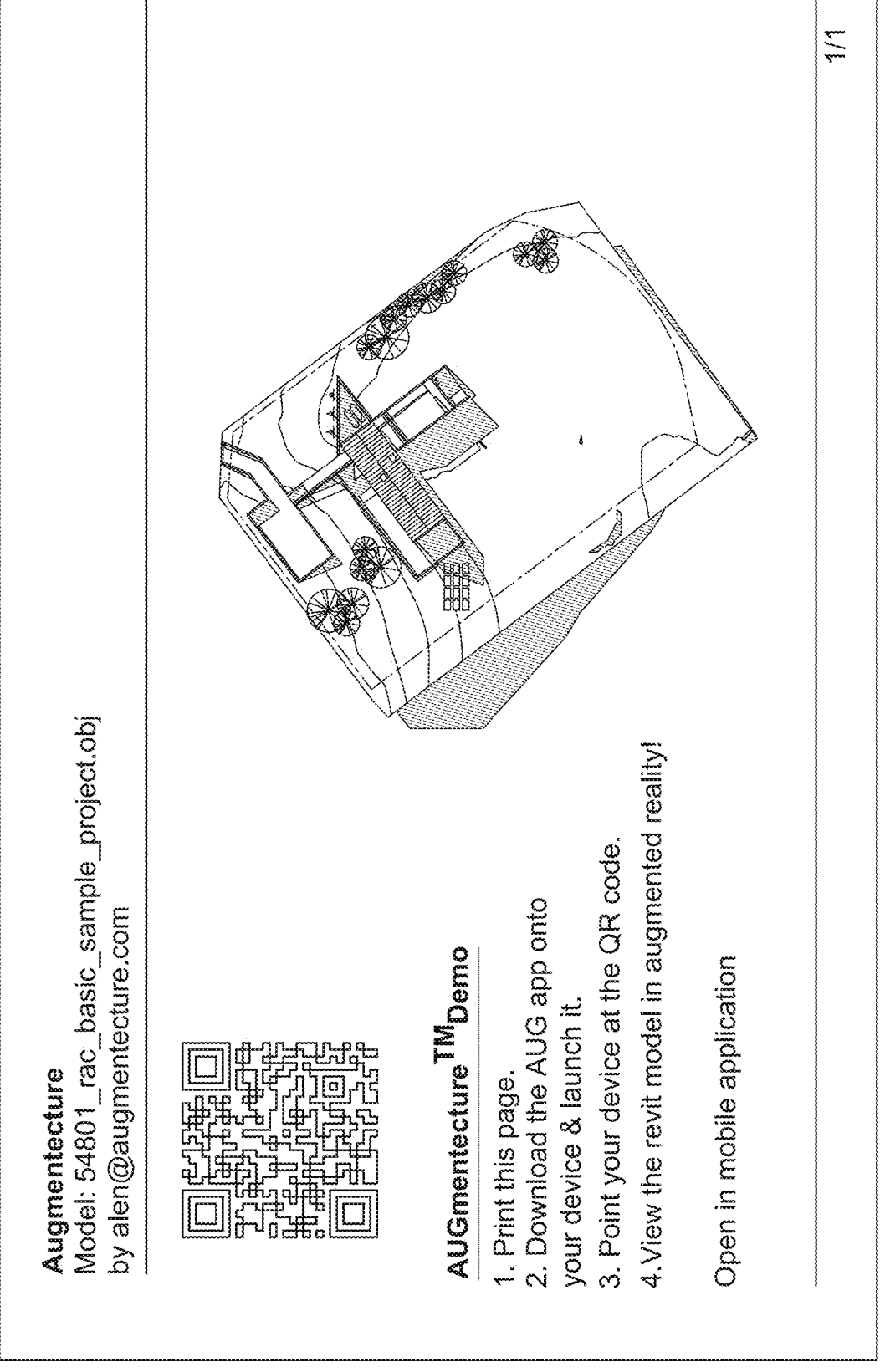
FIG. 3B illustrates where the AUG file includes a logo or company branding is utilized as an additional marker and a QR code as a first marker or the additional marker.

As an example, below are two representative examples of an AUG file. FIG. 3A illustrates where the AUG file may include a "Blueprint Marker" as the additional marker and a QR code as a first marker or initial marker. FIG. 3B illustrates where the AUG file includes a logo or company branding is utilized as an additional marker and a QR code as a first marker.

Figure 4:
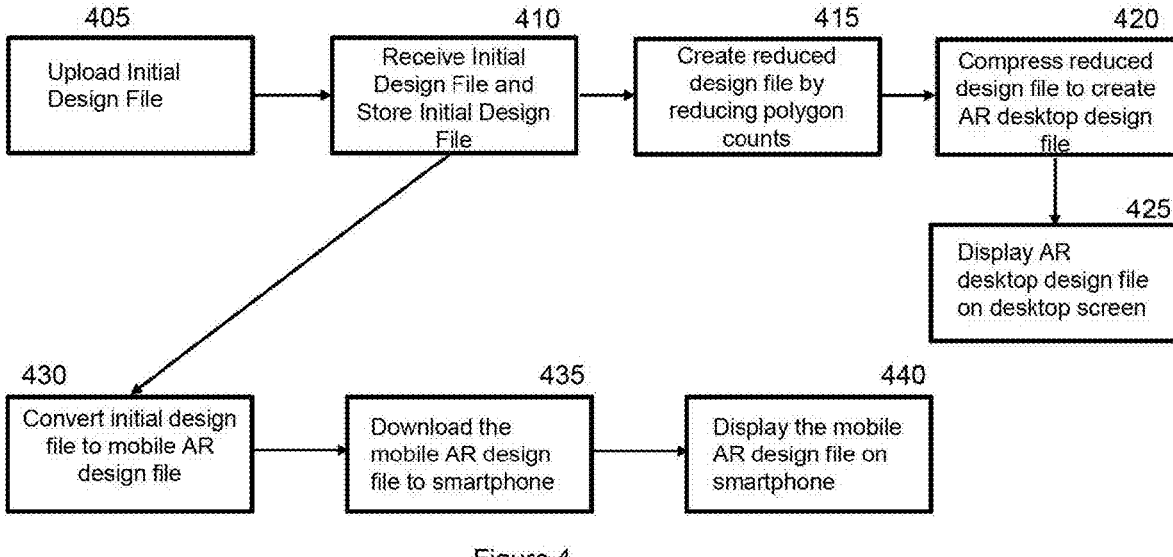
FIG. 4 illustrates a workflow of preparing file for viewing in a desktop AUGmentecture™ software application and/or viewing in the AUGmentecture™ mobile software application according to some embodiments.

FIG. 4 illustrates a workflow of preparing file for viewing in a desktop AUGmentecture™ software application and/or viewing in the AUGmentecture™ mobile software application according to some embodiments. This process is unique in that the process has as an input large OBJ files and outputs smaller manageable AR files (either mobile-enabled AR files (e.g., AR mobile design files) or desktop-compatible AR files (e.g., AR desktop design files)). No other architecture AR program includes a process where multiple AR file versions and/or formats are produced for a design so that multiple computing devices may display a design in AR format. In some embodiments, computer-readable instructions executable on the server computing device may include an application programming interface (API) to optimize the initial 3D design file created by the commercial design program (e.g., Revit or Autocad). In some embodiments, in step 405, the designer or architect may upload an initial design file to the backend processing server computing device (e.g. AUGmentecture™ backend processing server). In some embodiments, in step 410, the backend processing server computing device may receive the initial design file and store data, information and/or parameters associated with the design file in one or more memory devices of the backend processing server computing device. In some embodiments, in step 415, software on the backend server computing device may be executed by one or more processors to reduce polygon count in the design file to create a reduced design file. In some embodiments, in step 420, software on the backend server computing device may be executed by one or more processors to compress the reduced design file to create a desktop augmented reality file (e.g., AR desktop design file). In some embodiments, the compression may occur by compressing the design file's textures (e.g., the model's textures) and merging meshes of the 3D design file into one mesh. In this embodiment, the software on the backend server computing device may take an .OBJ file as an input and output a .FBX file. In some embodiments, in step 425, the desktop AUG software may be executed by one or more processors to display the desktop augmented reality file (which is in a .FBX format). In some embodiments, the software on the backend server computing device may be executed by one or more processors to prepare a mobile computing device viewable augmented reality file (which may be referred to as an AR mobile design file. In some embodiments, in step 430, software on the backend processing system (which may be a Unity 3D editor) may be executed by one or more processors to receive the design file (e.g., an .OBJ file) and may convert the file into a mobile AR design file. In some embodiments, this step may include the Unity Editor converting design file in an .OBJ format into asset bundles (which may assist in forming the mobile AR design file). Since this processing by the Unity Editor converts the files on the server computing device there is no need for the reducing of polygon count and compressing of textures utilized for the desktop AR files. In some embodiments, in step 435, the AUGmentecture™ mobile application software may be executed by one or more processors to download the mobile AR file to the mobile communication device (e.g., smartphone). In some embodiments, in step 440, the AUGmentecture™ mobile application software may be executed by one or more processors to display the mobile AR design file on a display of the mobile communications device, based on actions described previously (e.g., placing over a marker).

Use Case #3: Geolocation. In some implementations, an improvement may be made which utilizes geolocation coordinate features to pinpoint exactly how a structure looks in a position or location where the structure will be located. This is a novel and new feature that other architectural or structural design systems do not include and provides benefits of a client being provided with the most realistic view of the structure being designed.

Utilizing the geolocation feature, the architect, engineer or design professional may design a structure on Revit using a geolocation coordinate feature. In some implementations, the AUGmentecture™ software may request that the design professional, engineer or architect input one or more location coordinates for the structure being designed. In some implementations, the one or more location coordinates (e.g., which may be a geolocation coordinate) may be embedded in a design file created by the architect or design professional. In some implementations, after utilizing the geolocation feature, the design professional or architect may upload the created design file to the AUGmentecture™ backend server computing devices. In some embodiments, the geolocation coordinates may be included in the AUG file and/or the mobile AR design file.

In some implementations, the AUGmentecture™ software executing on the server computing devices may be executed by one or more processors to convert and/or compress the received design file to an augmented reality file. In some implementations, this may occur within a matter of minutes (e.g., from 1 to 10 minutes) and then the augmented reality file will be ready for viewing. In some implementations, the augmented reality file (e.g., the desktop AR design file and/or the mobile AR design file) may include geolocation coordinates. In some embodiments, any file (representing a model) having a geolocation parameter may be marked on the AUGmentecture™ dashboard 270 with a geolocation marker 298. FIG. 2Q illustrates an AUGmentecture™ file 272 with a geolocation marker 298 according to some embodiments.

In some implementations, using the procedure described above, a user may have an AUGmentecture™ mobile application software loaded onto their mobile communications device and the mobile communication device may be executed by one or more processors to download the augmented reality file with the geolocation coordinates into memory of the user's mobile communication device.

In some implementations, the user may select to activate and/or engage the geolocation feature and the AUGmentecture™ software app may receive the activation of the geolocation feature. In some applications, the AUGmentecture™ software app may be executed by one or more processors to generate and display, on a mobile communication display, a distance value and a directional indicator as to where the user is located with respect to the location of the proposed design structure. In some implementations, the user or operator may either drive or walk to the empty land or property where the proposed design may be built. In some implementations, the user may be on a physical site or at a geographical location where the structure may be built and may utilize the Geolocation GPS controlled widget or plugin on the AUGmentecture™ mobile app. As the user gets within a certain range, the AUGmentecture™ software application may be executed by one or more processors on the mobile communications device to suggest switching to a surface viewing mode in order to view the structure. Once the user gets to the geolocation specified in the augmented reality file, the AUGmentecture™ software may be executed by one or more processors to display the 3D model on the exact location where the structure will be located.

Figure 5A:
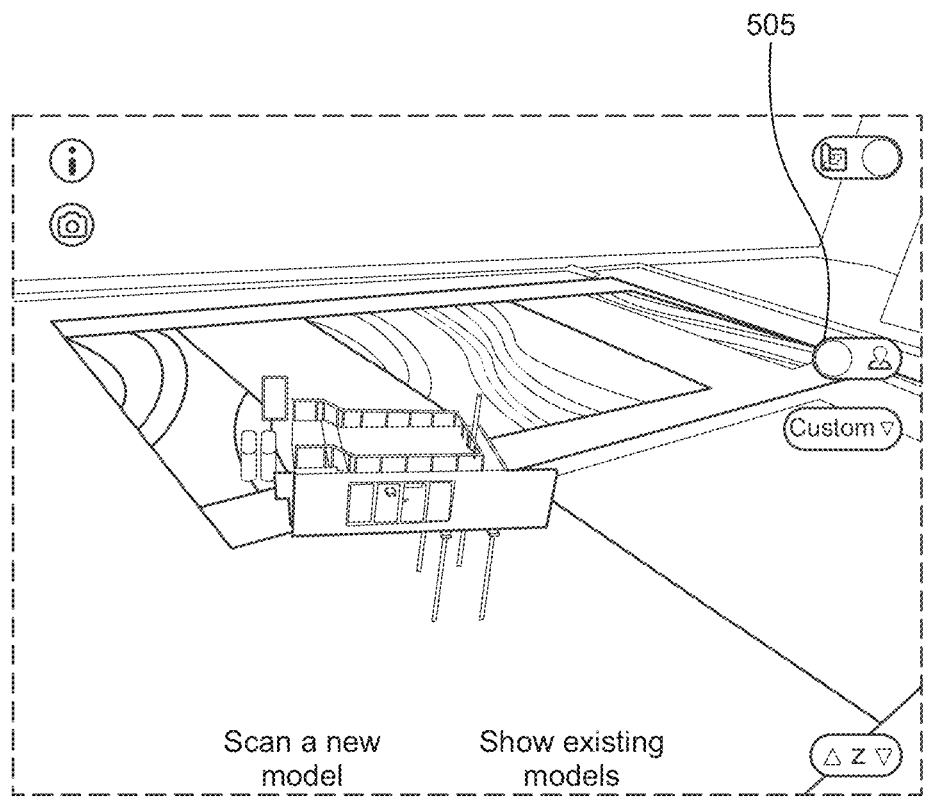
FIGS. 5A and 5B illustrate initial menus of an AUGmentecture™ mobile software application accordingly to some embodiments.
Figure 5B:
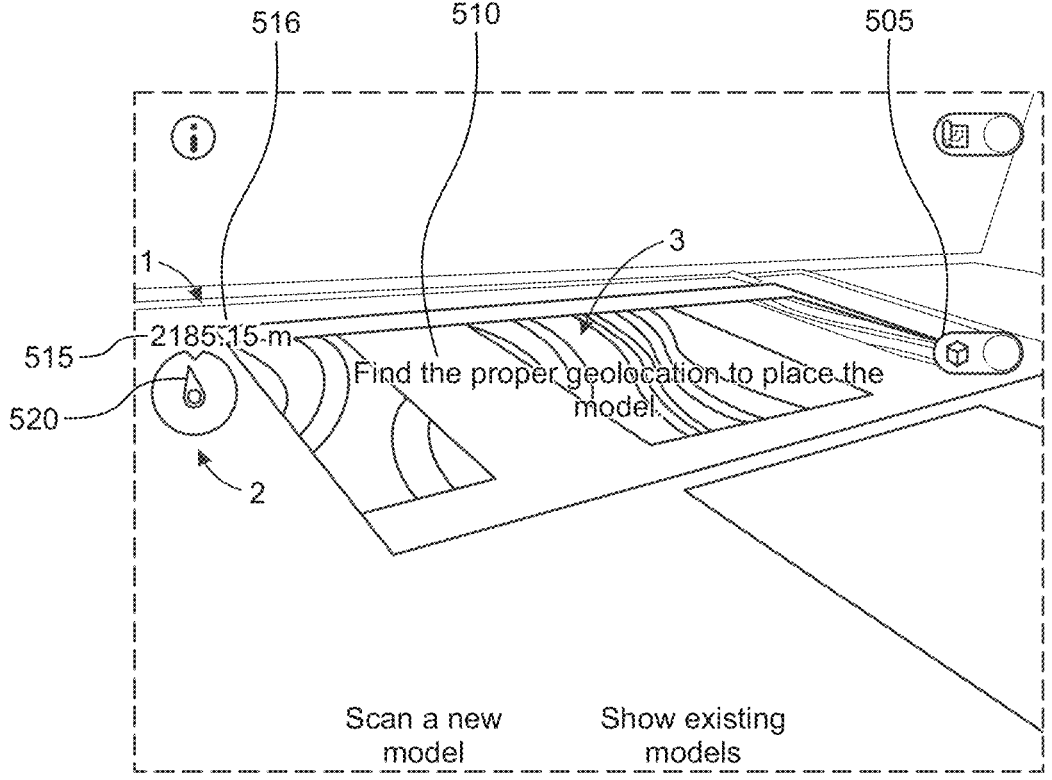

In some embodiments, a geolocation mode may be utilized when markers and/or plans may not be available. FIGS. 5A and 5B illustrate initial menus of an AUGmentecture™ mobile software application accordingly to some embodiments. In some embodiments, in order to go to a geolocation mode, a client or customer may need to select a button and/or switch. When viewing the model with the AUG mobile software application, a client or customer may see a switch button on a menu 505. When you tap the button, the AUG mobile software application may be executed by one or more processors to switch the standard mode to the Geolocation mode. Reference number 505 in FIGS. 5A and 5B illustrate the Geolocation switch in the AUGmentecture™ software application according to some implementations.

Figure 5C:
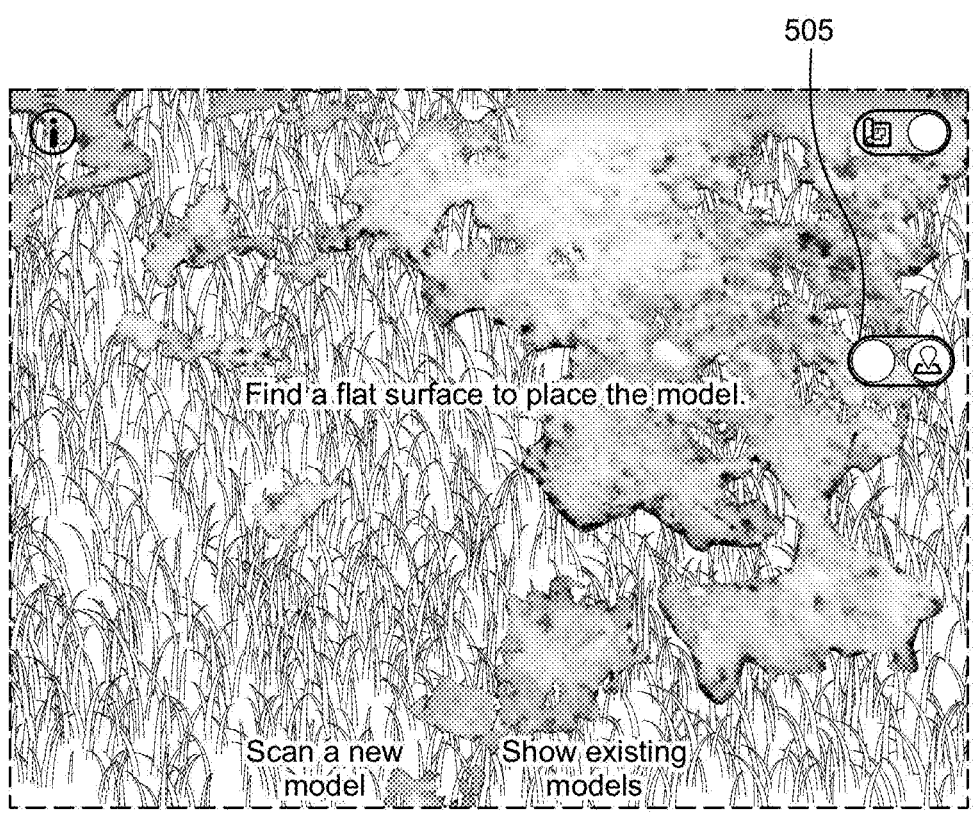
FIGS. 5C and 5D illustrates screens or menus in the AUGmentecture™ mobile software application in response to the selection of the Geolocation mode according to some embodiments.
Figure 5D:
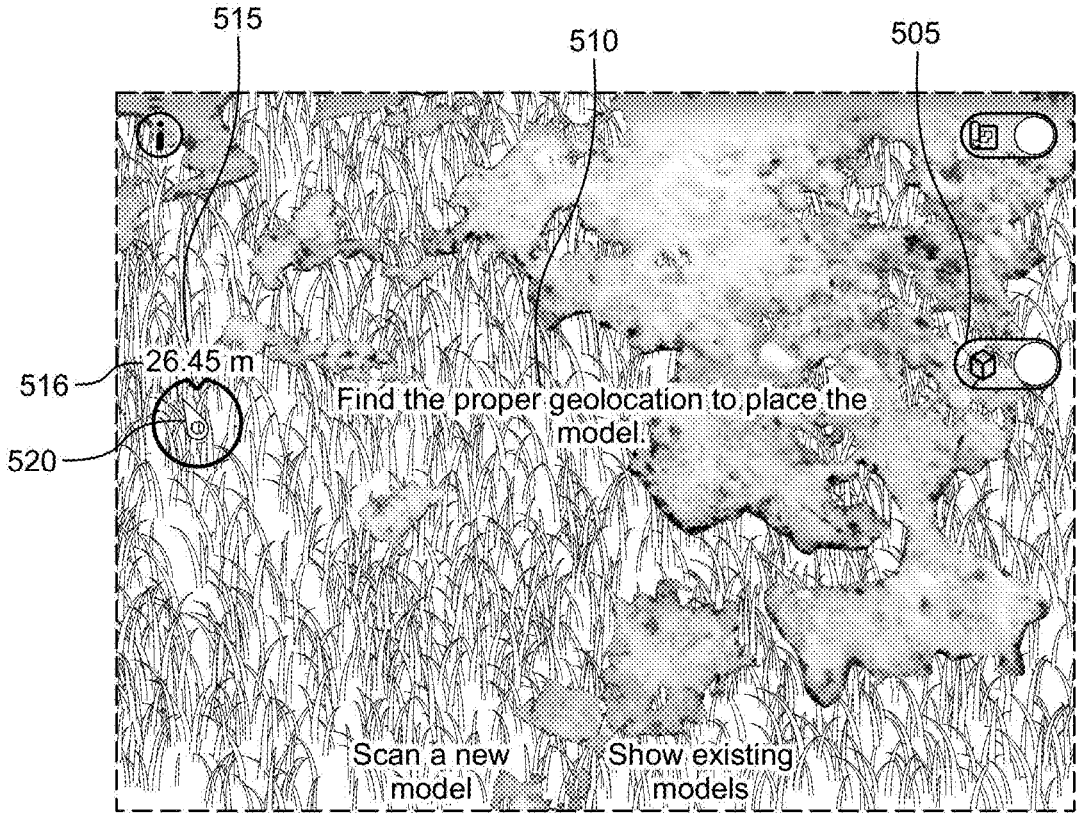

FIGS. 5C and 5D illustrates screens or menus in the AUGmentecture™ mobile software application in response to the selection of the Geolocation mode according to some embodiments. In some embodiments, the AUGmentecture™ mobile software application may be executed by one or more processors to display a message 510 asking to find a location where the 3D model should be placed. In some embodiments, the AUGmentecture™ mobile software application may be executed by one or more processors to display a compass or other directional element 515. In some embodiments, the compass or directional element 515 may identify a distance 516 and/or direction (e.g., E, W, N, or S) 520 that the user or operator needs to move to find the geolocation where the 3D model should be placed. In some implementations, the distance that is traveled may be 2185.51 meters (in FIG. 5B) and 26.45 meters (in FIG. 5D) in a slight northwest direction is shown.

Figure 5E:
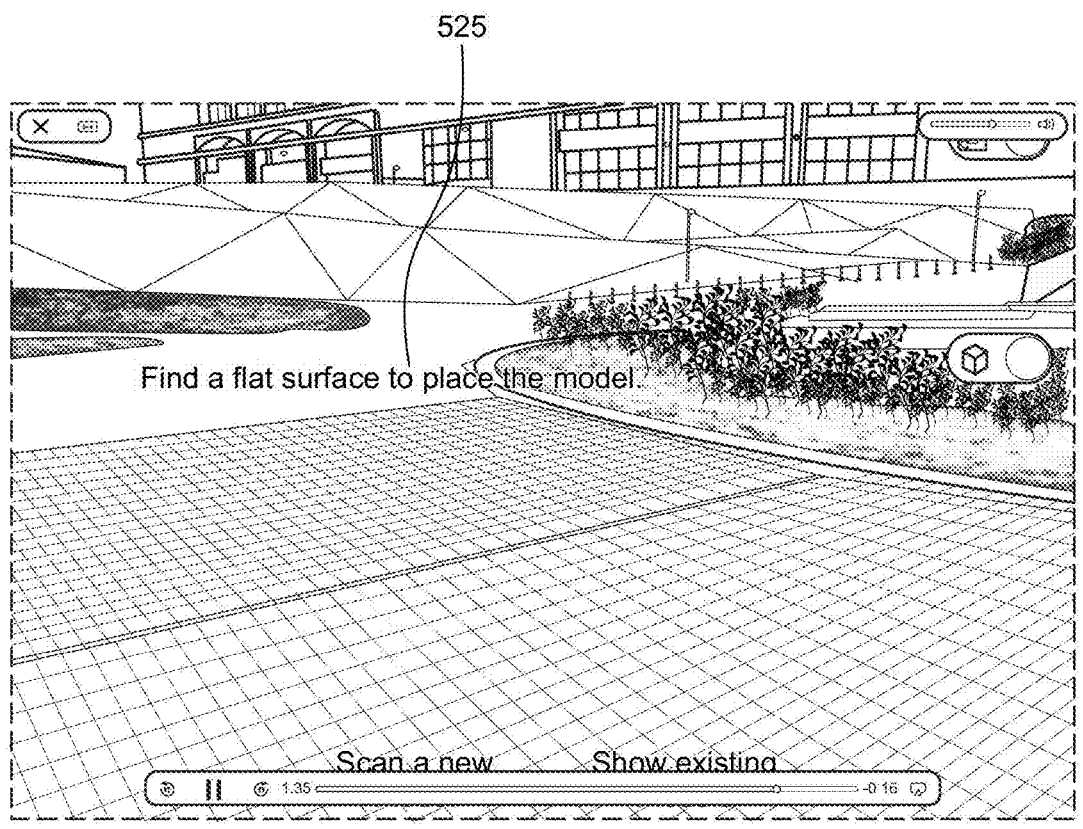
FIG. 5E illustrates a screen in the AUGmentecture™ mobile software application where a user is approaching the right location according to some embodiments.
Figure 5F:
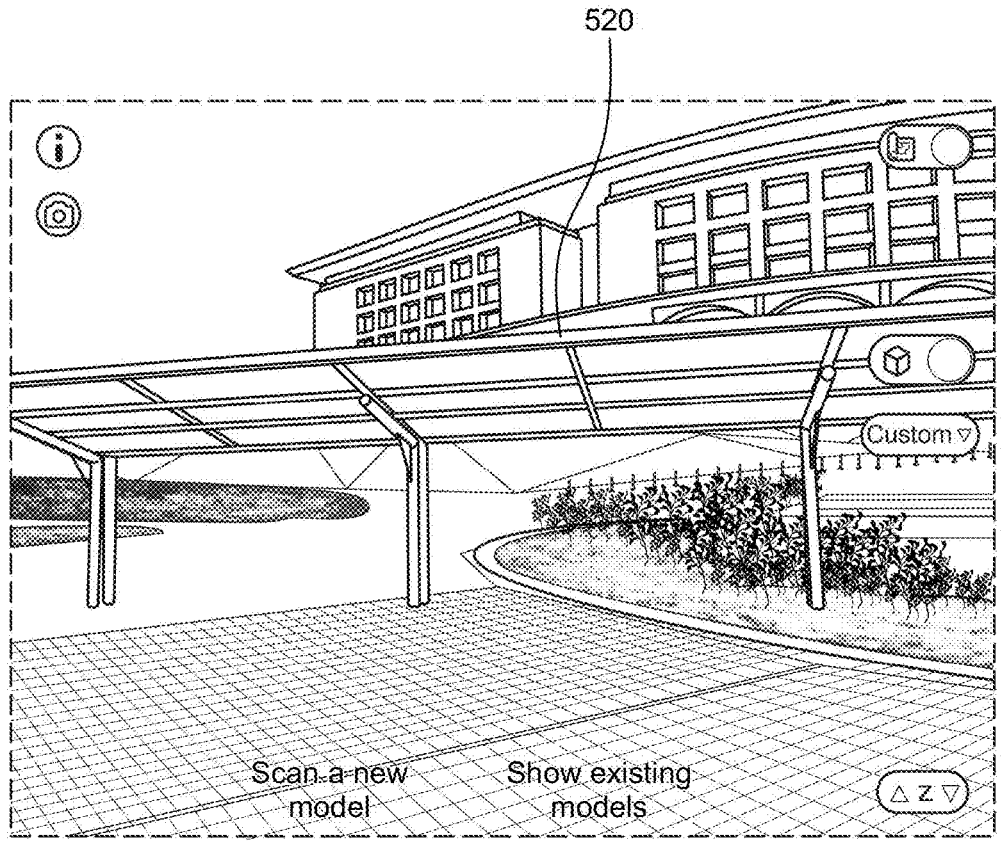
FIG. 5F illustrates a screen in the AUGmentecture™ mobile software application where the user is in the right location and the right orientation and view of the AR mobile design file is presented according to some embodiments.

In some embodiments, when the user or operator are close to the right location, the compass, distance and direction may disappear from the display screen and the AUGmentecture™ mobile software application may be executed by one or more processors to generate a message 525 that is displayed as "Find a flat surface to place the model" in the AUGmentecture mobile software application. FIG. 5E illustrates a screen in the AUGmentecture mobile software application where a user is approaching the right location according to some embodiments. In some embodiments, the enhanced augmented reality file (the design representing the 3D model) 520, may be placed and displayed at the right location with the right rotation and/or the right orientation in the menu or screen of the AUGmentecture mobile software application. FIG. 5F illustrates a screen in the AUGmentecture™ mobile software application where the user is in the right location and the right orientation and the AUGmentecture™ mobile application software may be executed by one or more processors to present the view of the AR mobile design file 520 according to some embodiments.

Figure 5G:
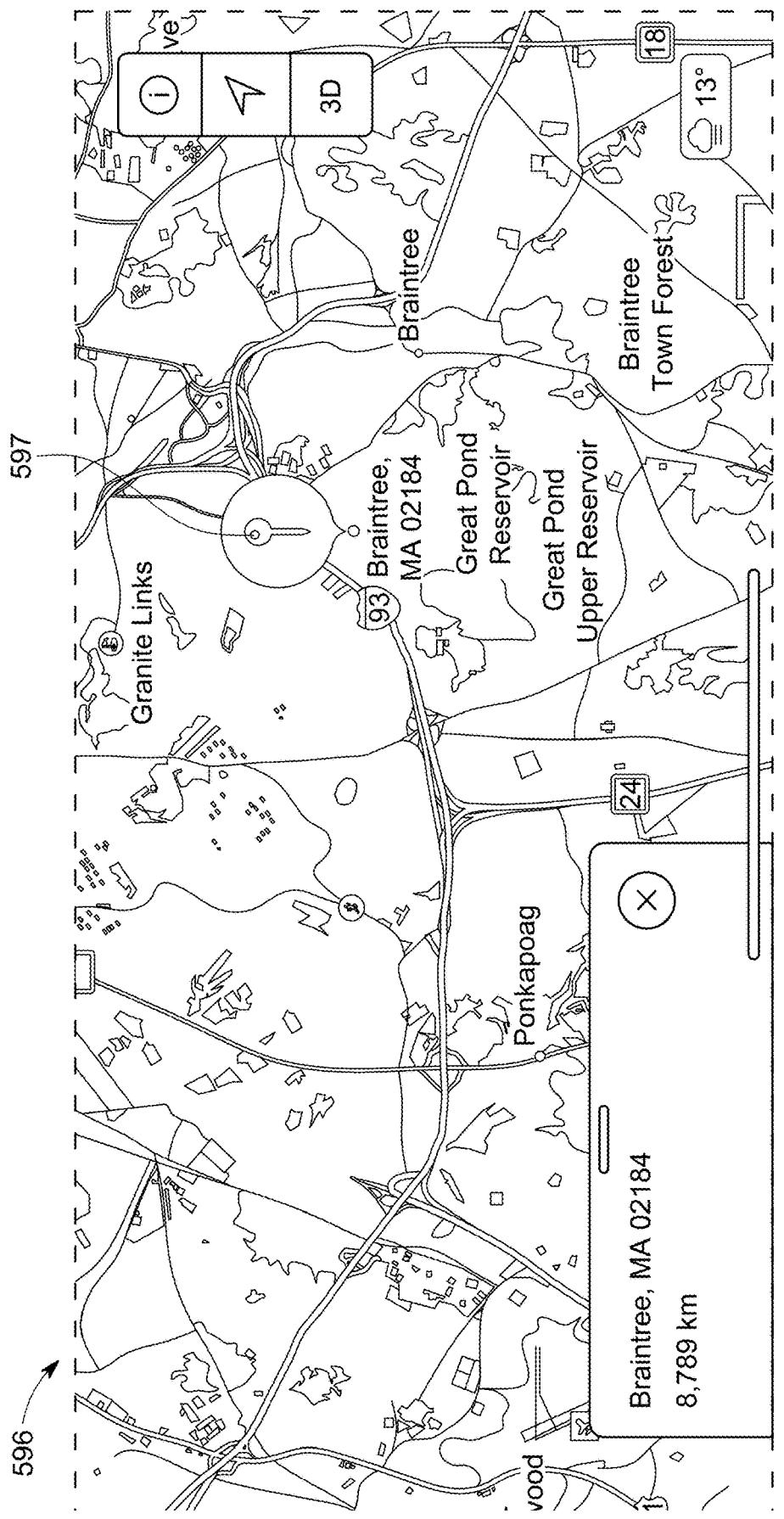
FIG. 5G illustrates a location 597 of a model or structure corresponding to the downloaded AUGmentecture™ AR file in a mapping software application.

In some embodiments, the AUGmentecture™ mobile application software may also include a map feature. In some embodiments, a user may turn on a map feature in the AUGmentecture™ mobile application software. In some embodiments, the mobile AUGmentecture™ application software may be executed by one or more processors to display a message asking the user if they would like to initiate the map mode. If the map mode is turned on, the mobile AUGmentecture™ application software may be executed by one or more processors to read the geolocation parameter from the downloaded AR file and communicate the geolocation parameter extracted from the downloaded AR file to a mapping application that is executable by one or more processors on the mobile computing device. In this embodiment, the mapping application may be executed by one or more processors to display a geographic location of a desired location for the model or structure based at least in part on the geolocation parameter. FIG. 5G illustrates a location 597 of a model or structure corresponding to the downloaded AUGmentecture™ AR file in a mapping software application 596. This allows a user to find directions to the location of the proposed model or structure.

Figure 6A:
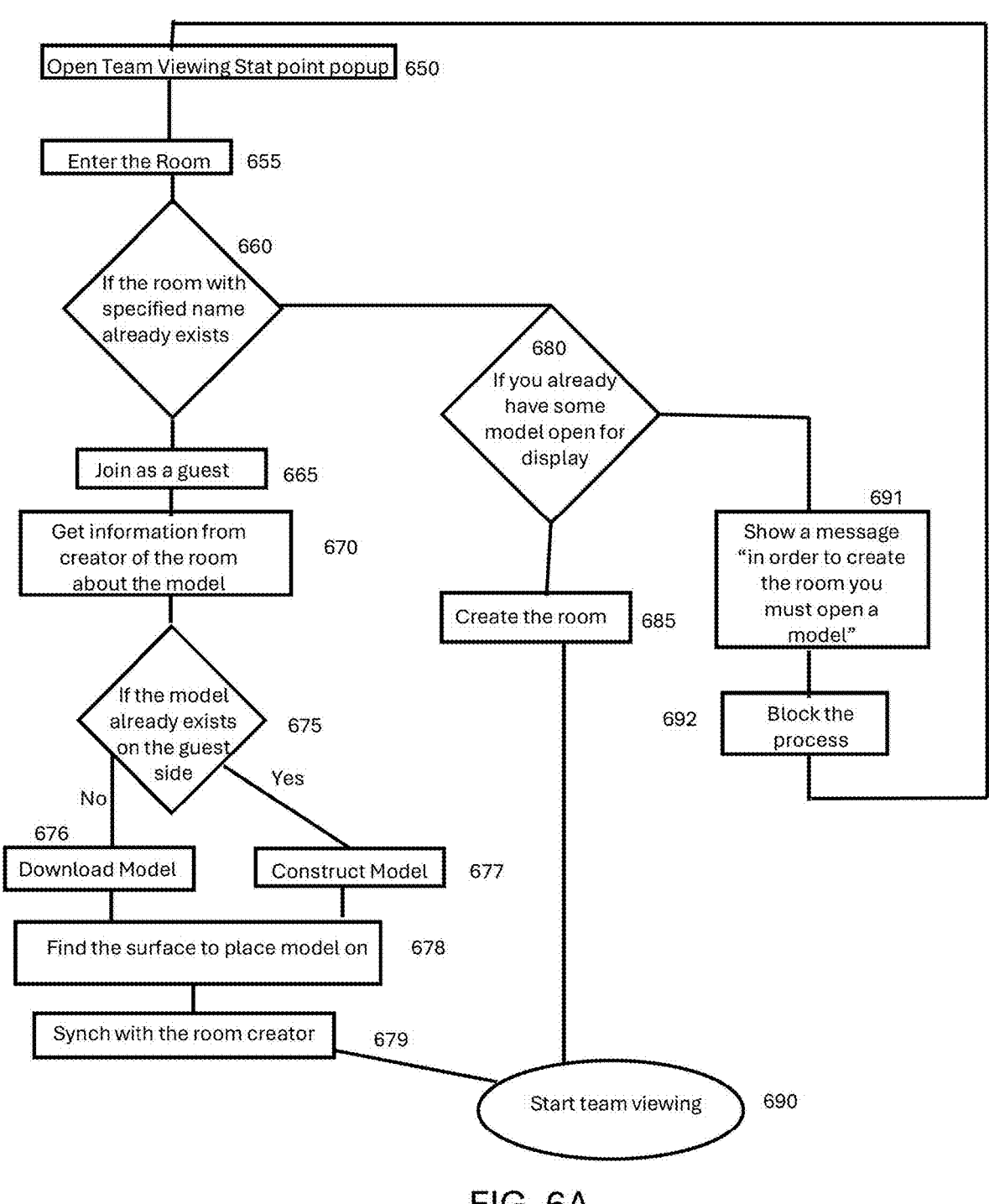
FIG. 6A illustrates a flowchart for implementing a team view application feature according to some implementations.

FIG. 6A illustrates a flowchart for implementing a team view application feature according to some implementations. In some implementations, a user may be utilizing the AUGmentecture software to view three-dimensional models of architecture plans (which may be referred hereinafter to as a model). In some implementations, in step 650, a user of the AUGmentecture software may open team viewing or a team viewing feature, which may be a start point popup. In these implementations, in step 655, the user may then enter the virtual room and enter the name of the virtual room. In some implementations, in step 660, the AUGmentecture software may determine if the room with the specified name already exists. In other words, has this virtual room been established previously. If the AUGmentecture software determines that the named virtual room does not exist, in step 680, the AUGmentecture software asks the user if there is already have some model open for display. In some implementations, if a model is not open for display and thus team sharing cannot start, in step 691, the AUGmentecture software generates and displays a message which states, for example, "in order to create the virtual room, you must open a model." In some implementations, in step 692, the AUGmentecture software may also block a team viewing process from operating if there is no model open. In some implementations, if the model is already open, then in step 685, the AUGmentecture software may create the virtual room and in step 690, may initiate or start a team viewing session. In some embodiments, the model may be referred to as an architectural design model or as a three-dimensional architectural design model.

In some implementations, if a virtual room with the inputted name already exists, the user (and an associated computing device may join as a guest) in step 665. In some implementations, in step 670, the AUGmentecture software may obtain and/or gather information about the three-dimensional (3D) design model that is open. In some implementations, in step 675, the AUGmentecture software (on the other users computing devices) may determine if the three-dimensional (3D) design model exists on the guest computing device. In some implementations, in step 676, if the 3D design model or model does not exist on the guest computing device, the AUGmentecture software on the guest computing device(s) may download the 3D design model file. In some implementations, in step 678, the guest may locate a surface to place a visual representation of the 3D design model on. In some implementations, in step 677, if the 3D design model file exists on the guest computing device, the AUGmentecture software may construct the 3D design model file. In some implementations, in step 678, the guest may find a surface on which to place a visual representation of the 3D design model. In some implementations, in step 679, the AUGmentecture software may synchronize the guests (and their associated computing devices) with the room creator (and/or his computing device). In some implementations, in step 690, the AUGmentecture software may begin team viewing with the room creator and/or the guests and all of the associated computing devices. The number of additional guests may be one or multiple guests.

Figure 6B:
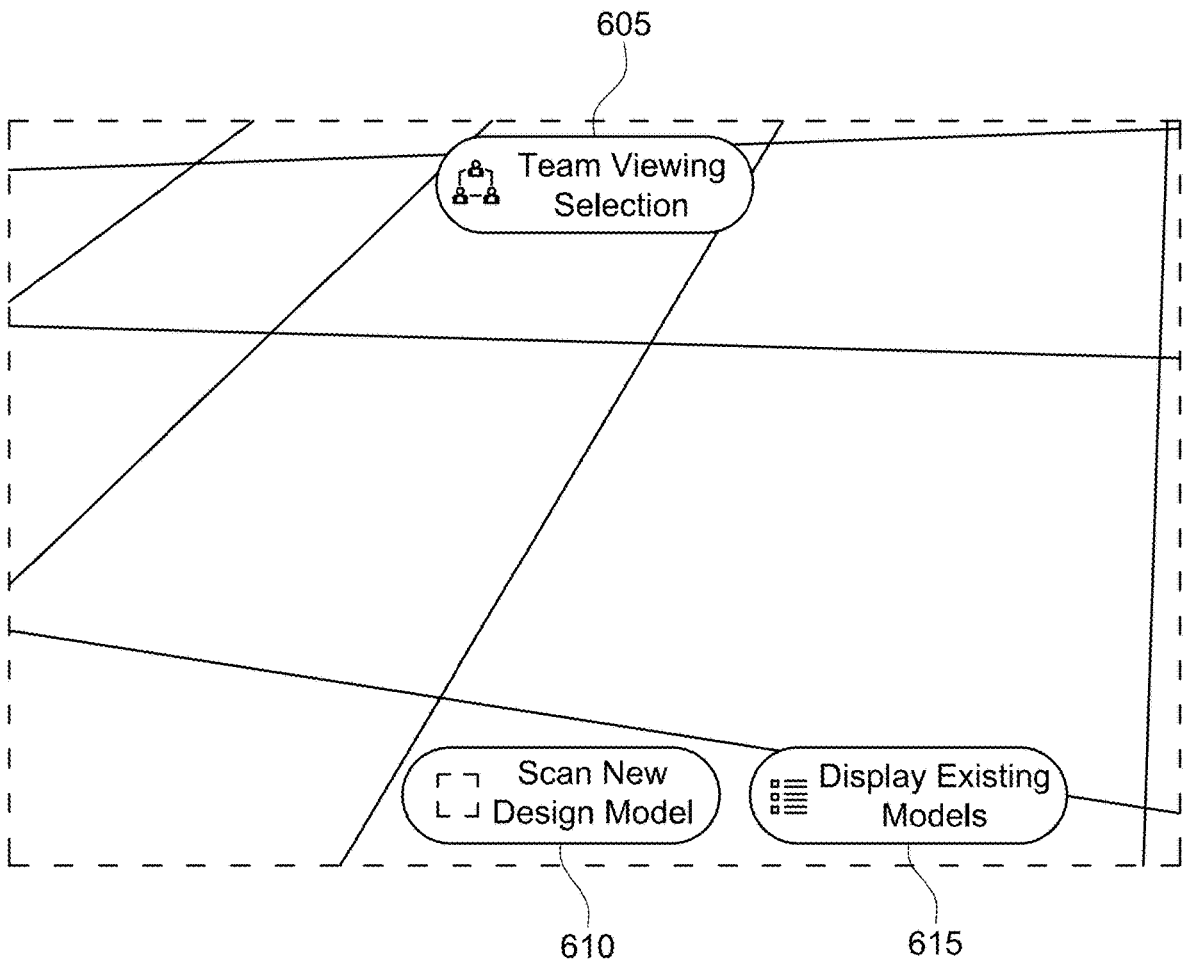
FIG. 6B illustrates an initial team viewing screen in the AUGmentecture software according to some implementations.

In some implementations, the AUGmentecture Software may also include a team viewing option. FIG. 6B illustrates an initial team viewing screen in the AUGmentecture software according to some implementations. In some implementations, as an illustrative example, the AUGmentecture software may generate a menu including an option to select team viewing 605, an option to scan a new architectural design models 610, and/or an option to display existing architectural design models 615. In some implementations, an AUGmentecture software user may click on the team viewing option or button 605, as illustrated in FIG. 6B, to select the team viewing option 605.

Figure 7:
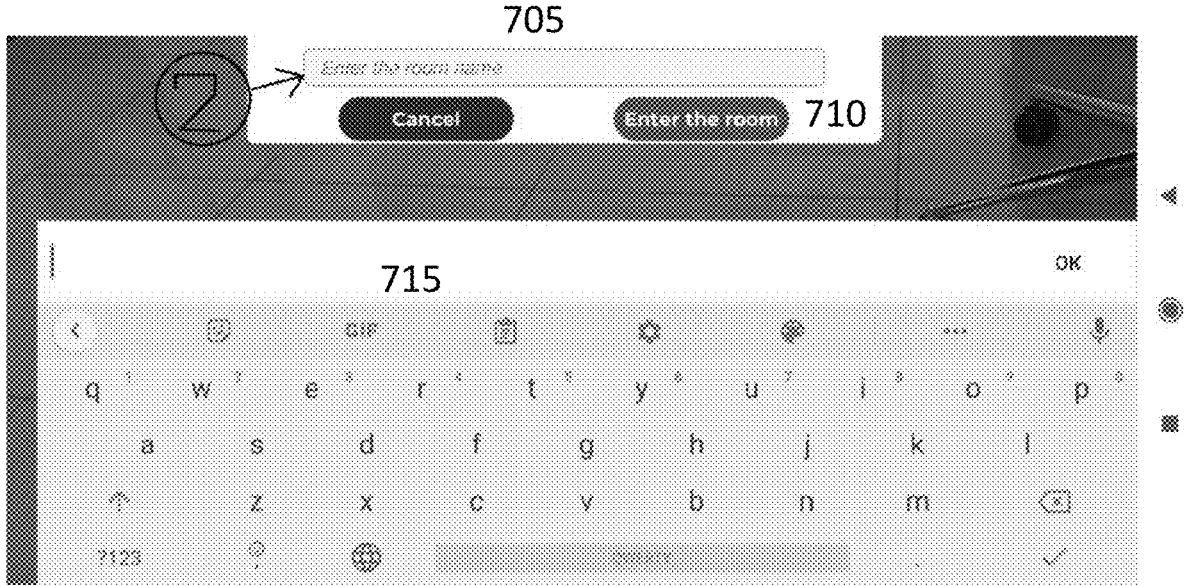
FIG. 7 illustrates a room naming feature in the team viewing portion of the AUGmentecture software according to some implementations.

FIG. 7 illustrates a room naming feature in the team viewing portion of the AUGmentecture software according to some implementations. In some implementations, a AUGmentecture software application may generate a keyboard image 715 to allow a AUGmentecture software user to select and input a room name in a room name field 705 and then an enter button or icon 710 to allow the AUGmentecture software user to enter a selected virtual room.

Figure 8:
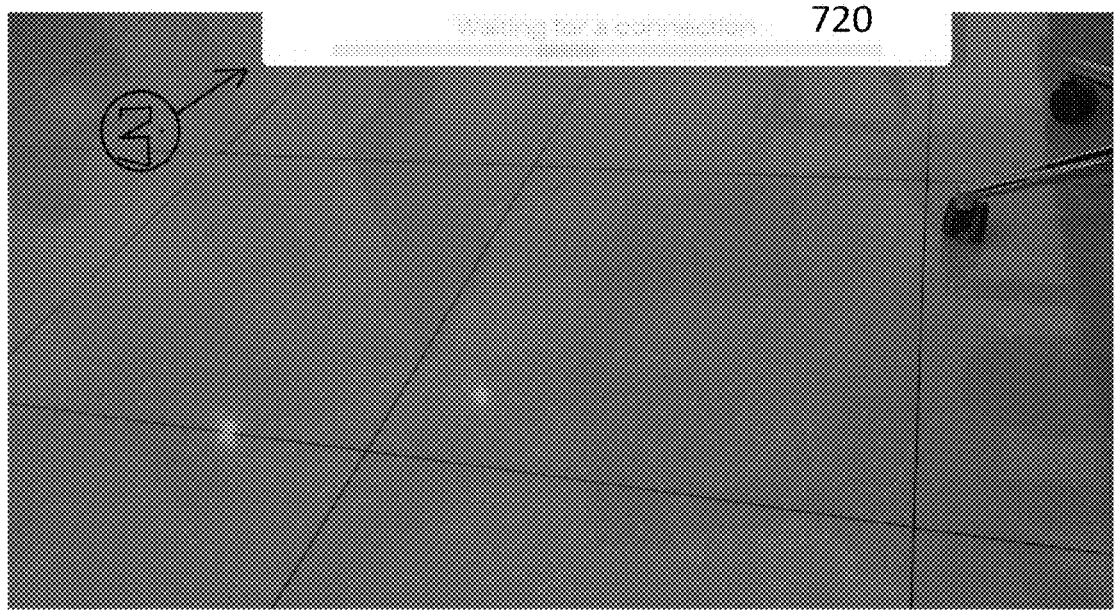
FIG. 8 illustrates a creation of the name virtual room according to some implementations.

In some implementations, in response to the AUGmentecture software user selecting to enter the room, the AUGmentecture software checks to see if a virtual room by that name exists in a virtual room list or database. If the AUGmentecture software determines that a virtual room by that name does not exist and if there is an architectural design model or 3D architectural design model open for viewing and/or demonstration, then the AUGmentecture software generates and/or creates a virtual room having the selected name, adds it to the virtual room list and/or database, and allows the AUGmentecture user to enter the virtual room. FIG. 8 illustrates a creation of the name virtual room according to some implementations. As illustrated in FIG. 8, the AUGmentecture software may display a waiting for a connection message 720. This will occur as the AUGmentecture software is processing the room entry request.

Figure 9:
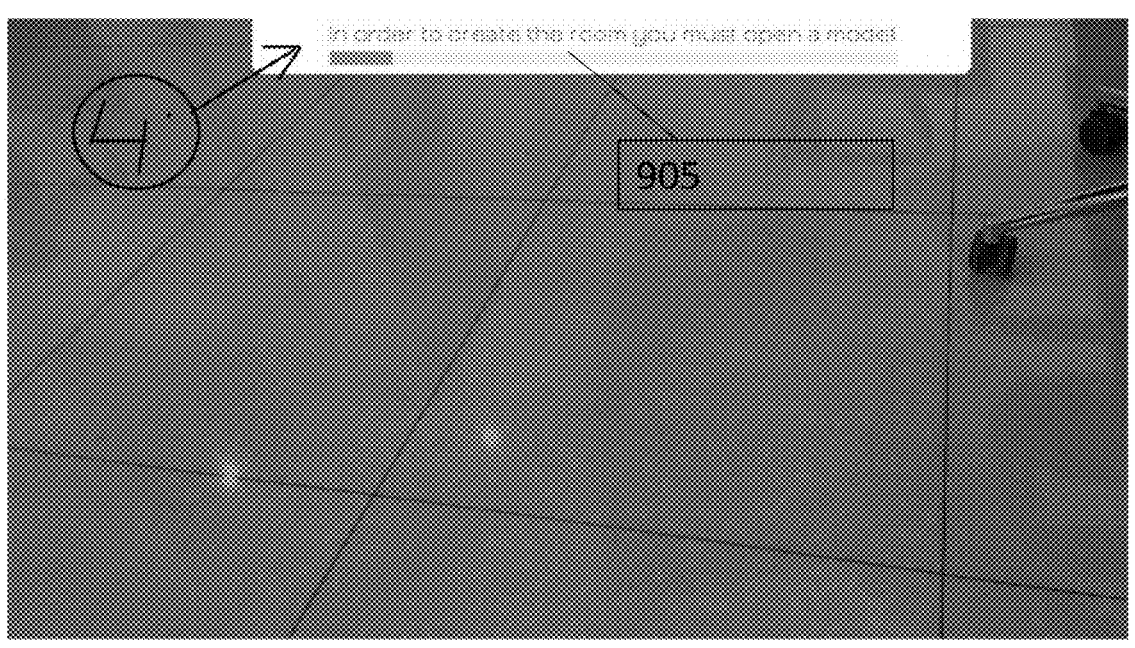
FIG. 9 illustrates an AUGmentecture software screen requesting an AUGmentecture user to select a model 905 to be incorporated into the AUGmentecture team viewing feature.

In some implementations, if there is no architectural design model open or being utilized in the AUGmentecture software, the AUGmentecture software may generate a message requesting that the user selects, uploads, creates and/or shows an architectural design model. After the architectural design model is selected, the AUGmentecture software may then create the virtual room having the selected name, adds the named virtual room to the virtual room list and/or database, and allows the AUGmentecture user to enter the named virtual room (which is associated with the selected, uploaded or created architectural design model). FIG. 9 illustrates an AUGmentecture software screen requesting an AUGmentecture user to select a model 905 to be incorporated into the AUGmentecture team viewing feature.

In some implementations, the named virtual room may already exist with the associated architectural design model. In some implementations, if the named virtual room already exists, then the AUGmentecture software may notify all prior participants in the selected virtual room that the virtual room is open for team viewing. In some implementations, a master user may add individuals (e.g., via emails, phone numbers or other electronic identifications) as guests in the selected virtual room, and the AUGmentecture software may communicate messages to computing devices of the added individuals identifying that the virtual room has been created and that the individuals may participate in team viewing of the selected architectural design model.

Figure 10:
FIG. 10 illustrates a screen that the guests may see on their computing device display after they have entered the virtual room and as the architectural design model file is being downloaded to their associated computing device.

In some implementations, one or more guests (via their associated computing devices or mobile computing devices) may login to AUGmentecture software and may enter the selected virtual room by typing in the entered room name. In response to entering the selected virtual room, the AUGmentecture software may download the architectural design model file to the one or more user's computing devices so that guests/participants may view the architectural design model file on their computing device. FIG. 10 illustrates a screen that the guests may see on their computing device display after they have entered the virtual room and as the architectural design model file is being downloaded to their associated computing device. In some implementations, the message may be "Preparing to Construct rac_advanced_sample_project_test model 1005. In some implementations, after downloading of the architectural design model file has completed for the users or guests, the users or guests may see the same architectural design model file and/or the viewing of the architectural design model file may be synchronized. In some implementations, the AUGmentecture software may only allow the master user (at their computing device or mobile computing device) to control viewing and/or manipulating an image of the architectural design model file. In some implementations, the AUGmentecture software may allow any of the users or guests (and their associated computing device) to control viewing and/or manipulating of an image of the architectural design model file. There are many features and/or functions that the master user (or other users) may utilize when the AUGmentecture software is in team viewing mode and/or utilizing the team viewing feature. In other words, the AUGmentecture software may be flexible in allowing the master user to be the only controller or manipulator of an image of the architectural design model file in some situations and in other situations, the AUGmentecture software may allow all users or a subset of users to be able to be the controller or manipulator of the image of the architectural design model file.

Figure 11:
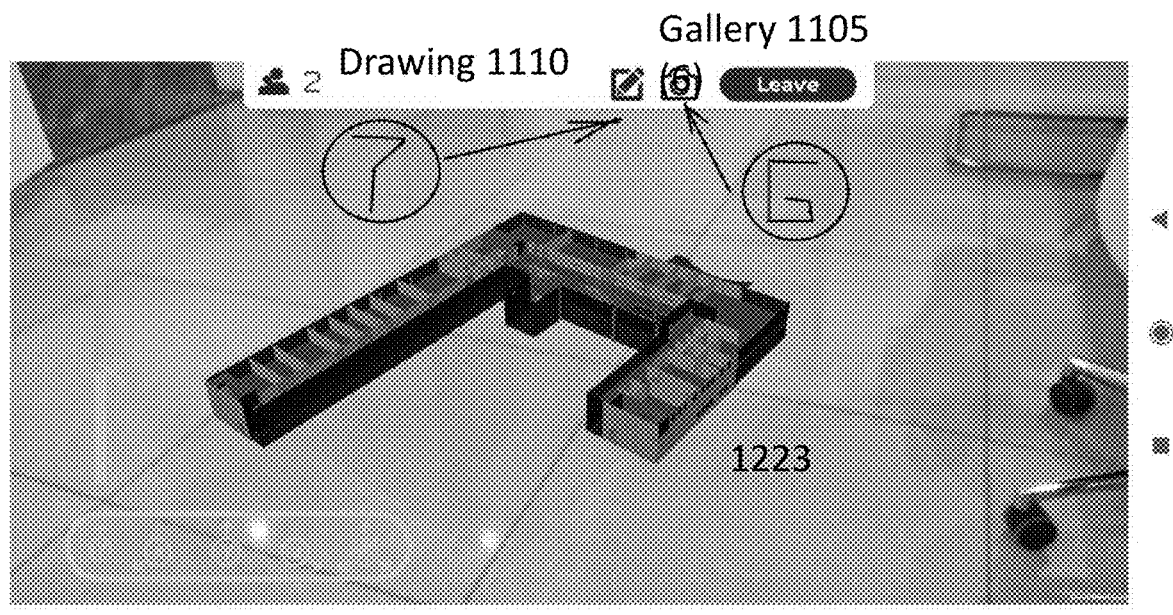
FIG. 11 illustrates a gallery button or selection icon that may be selected by the master user (or other users) to save the screenshot file to the gallery memory in the AUGmentecture software.

The AUGmentecture software may also have other features. In some implementations, for example, a master user (or other users when they have control) may take or capture a screenshot of a display of the associated computing device (which shows an image of the architectural design model file and a virtual embodiments where the architectural design model file is positioned or located) and may save the screenshot file to a gallery memory in the AUGmentecture software. In some implementations, the gallery memory of the mobile computing device may be stored in one or more memory devices of the computing device that is executing the AUGmentecture software. In other words, the gallery memory may store one or more screen shots. FIG. 11 illustrates a gallery button or selection icon 1105 that may be selected by the master user (or other users) to save the screenshot file to the gallery memory in the AUGmentecture software.

Figure 12:
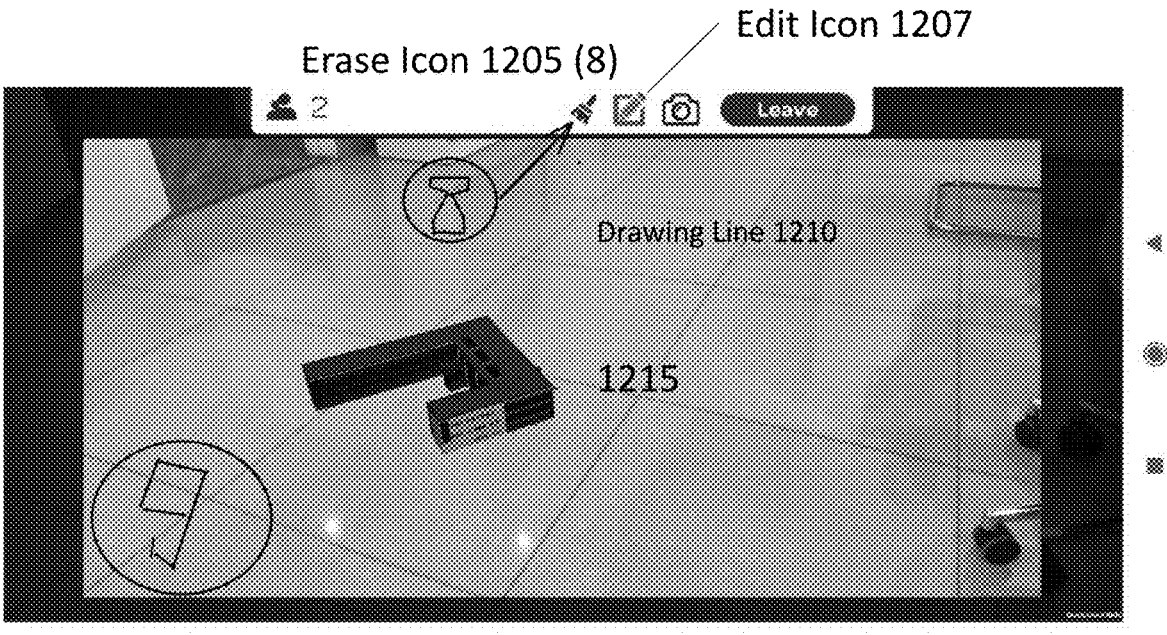
FIG. 12 illustrates a deletion or erase button, an edit or modification button, and/or a drawing line that is to be deleted or erased utilizing the deletion or erase button.

In some implementations, for example, a master user (or other users who have control) may draw on or make notes on the screenshot to illustrate different items or features of the architectural design model. In some implementations, for example, a master user (or other users who have control) may edit the screenshot to change or modify the architectural design model 1223. In some implementations, for example, a master user (or other users who have control) may select a drawing icon or button and the AUGmentecture software may allow the master user (or other users who have control) to draw on the architectural design model image displayed on the screen. FIG. 11 illustrates a drawing button or icon 1110 in the team viewing mode of the AUGmentecture software according to some implementations. In some implementations, a master user (or other users who have control) may also erase what is drawn in the team viewing mode. In some implementations, notes, lines or other shapes may be drawn on a screen of the master user's computing device (or other users' computing device). In some implementations, a master user (or other users who have control) may select what has been drawn and then select an erase or delete button or icon to delete what has been drawn. FIG. 12 illustrates a deletion or erase button 1205, an edit or modification button 1207, and/or a drawing line 1210 that is to be deleted or erased utilizing the deletion or erase button 1205, in the team viewing mode of the AUGmentecture software application. In some implementations, where a master user (or other users who have control) selects or clicks on an edit button 1207, the AUGmentecture software takes an additional screenshot to create an annotated image of the 3D architectural design model and the virtual environment where the model is positioned, saves the annotated image of the design model and virtual model to one or more memory devices of the computing device and communicates and/or transmits the annotated image of the 3D architectural design model and virtual environment to the other users (and associated computing devices) that are in the virtual room. In this implementation, the other users may then see the annotated image on their computing devices and/or screens (e.g., of the annotations, the design model and the virtual environment). In some implementations, as the user (or other users) draws on the screen or display, any markings made by the master user (or other users who have control) are first captured in a screen shot (along with the 3D design model and the virtual environment), stored in the one or more memory device of the computing device that made the change, and the image of the markings, the 3D design model, and the virtual environment is transmitted and/or communicated to the other users (and/or their computing devices) and displayed on the screen of all of the computing devices that are part of the team viewing option.

Figure 13:
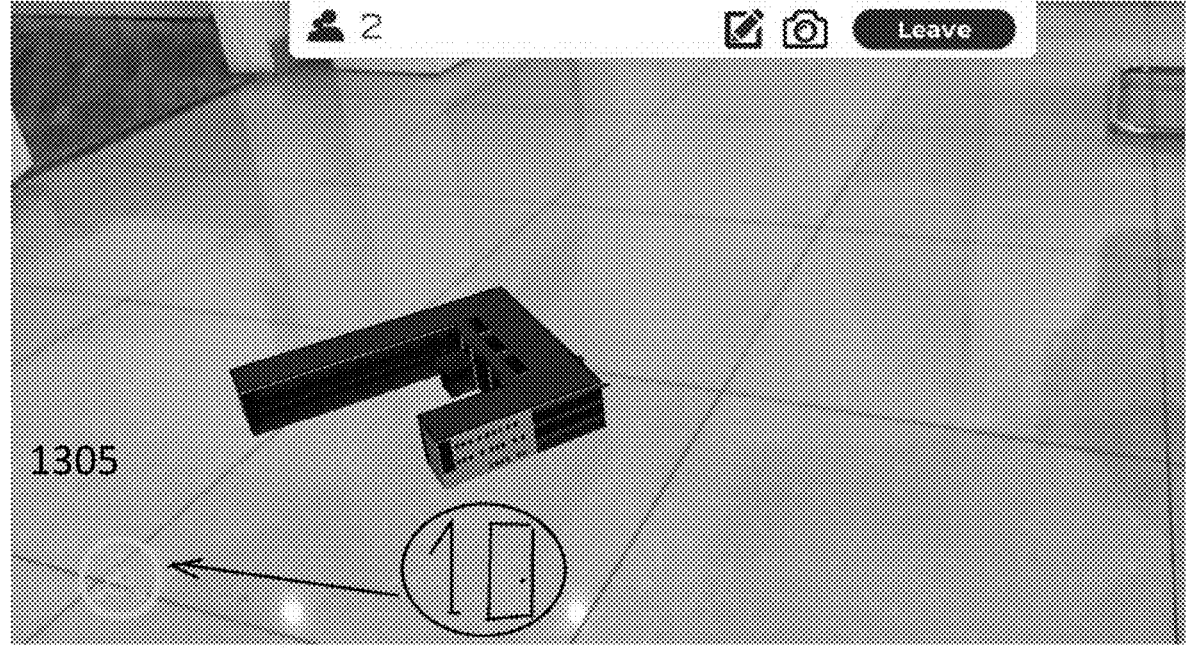
FIG. 13 illustrates selecting of a specific plane 1305 to cut off or view the architectural design model from according to some implementations.

In some implementations, utilizing the team viewing software, the master user (or other users who have control) may select an area to cut off a portion of the architectural design model and the AUGmentecture software may display an image of the architectural design model with the cutoff portion removed along in the virtual environment. In some implementations, for example, a user may select an erase icon 1205 in the screen shown in FIG. 12. FIG. 12 illustrates the result of a master user (or other users) if they have control, erasing a portion of the building (e.g., part of the left side of the building 1215 has been erased). FIG. 11 also displays how a user can select to cut off floors of an architectural design model and how the AUGmentecture software will generate an image cutting off floors (e.g., two floors) in order to let a user can see the floor plan for a single floor of the architectural design. In some implementations, this allows users to see specific portions of the architectural design model (e.g., a number of floors of a building, a wing of a building, or a building with a roof removed). Thus, the team members can all see these different aspects at the same time. In each of these circumstances, any changes that a master user (or other users who have control to make changes) makes are captured along with the 3D design model and the virtual environment, stored as a modified or annotated image in one or more memory devices of the computing device where the change was made, and the modified or annotated image (which is the changes, the 3D design model and the virtual environment) is communicated to the other computing devices that are part of or in the virtual room. The other computing devices then display the modified or annotated image (including the changes, the 3D design model and the virtual environment) on a screen of the computing device. FIG. 13 illustrates selecting of a specific plane 1305 to cut off or view the architectural design model from according to some implementations. FIG. 13 also illustrates how the AUGmentecture software has generate an image where without the drawing line. In other words, the user selected the erase feature or icon 1205 and selected for the drawing line 1205 to be erased and the AUGmentecture software generated erased the drawing line in the generated image.

FIG. 14A illustrates a user drawing lines or shapes utilizing a team viewing application according to some implementations. FIG. 14B illustrates another user's computing device receiving and displaying the added drawing lines or shapes according to some implementations. In some implementations, a user who is in control (e.g., who is allowed to make edits, additions or deletions to a team viewing screen) may draw lines or shapes on a screen of their mobile computing device, as illustrated by reference number 1405 in FIG. 14A. In some implementations, the user may press a gallery icon which may save an image displayed on the screen of the user's computing device (e.g., mobile computing device) to the one or more memory devices of the user's mobile computing device. In addition, in some implementations, the image displayed on the user's mobile computing device may be communicated to other user's computing device that are enrolled in or participating in the team viewing group or virtual room. In some implementations, the image may include the lines or shapes 1410 drawn on the user's mobile computing device, the 3D architectural design model and/or an environment or surface where the 3D architectural design model has been positioned. In some implementations, the communication may be done in real time. In some implementations, the other users' computing devices may then display the received image on displays of their computing devices (which may be mobile computing devices). FIG. 14B illustrates the received image being displayed on other users' computing devices where the image includes the lines and/or shapes 1410 drawn by the original user on the display of the original user's computing device. In some implementations, if the other users also have control and the ability to edit, delete, draw on or modify the screen in team viewing, the other users can also draw on or make notes on the image that is displayed on their mobile computing device. The other user can then select a gallery button and the revised image (with the edits, deletes, drawings and/or notes that the other user made) may be saved to the one or more memory devices of the other users computing device or mobile computing device. In some implementations, the other user's computing device may communicate the other user's revised image to other users' (including the original user's or master user's ) computing devices that are in the team viewing virtual room. In some implementations, the other user's revised image (which include the drawings or annotations, the 3D design model and the virtual environment) is then displayed on the screen of the other users' computing devices that are in the selected virtual room.

In other words, when an original user creates a virtual room, and the original user invites people to join into that virtual room, (which could be 1 of more people), the other users in the virtual room may see the navigation and/or editing of the 3D architectural design model on the mobile computing device in real time. In addition, the original user can perform edit functions such as marking and writing notes on the image. To do this, the model view on the screen of the mobile computing device remains static while the original user is making their edits. In addition, the original user has the ability to take a photo screen capture of all or some the edits. These photos will automatically go to the original user's photo album in the one or more memory devices of the original user's mobile computing device. These photos could later or in real time be sent via email or file sharing for record keeping on everyone's computing devices.

In some implementations, when an image of the mobile computing device screen is shared in the team viewing mode, a user can do all the things in real time and every user who is in this virtual meeting room can then enjoy the same effects. These effects once again could be captured on the user's photo album while in the edit mode, but the actual original 3D architectural design model (e.g., an electronic copy) is not changing because the team viewing feature and the AUGmentecture software are not a modeling software tool. However, at the end of this TeamViewing session, the original version of the 3d architectural design model which was not on the other people's mobile computing devices may gets saved into the memory devices of their mobile computing devices, even though the other people never downloaded an electronic copy of the 3D design model on their own.

As detailed above, the computing devices and systems described and/or illustrated herein broadly represent any type or form of computing device or system capable of executing computer-readable instructions, such as those contained within the modules described herein. In their most basic configuration, these computing device(s) may each comprise at least one memory device and at least one physical processor.

The term "memory" or "memory device," as used herein, generally represents any type or form of volatile or non-volatile storage device or medium capable of storing data and/or computer-readable instructions. In one example, a memory device may store, load, and/or maintain one or more of the modules described herein. Examples of memory devices comprise, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In addition, the term "processor" or "physical processor," as used herein, generally refers to any type or form of hardware-implemented processing unit capable of interpreting and/or executing computer-readable instructions. In one example, a physical processor may access and/or modify one or more modules stored in the above-described memory device. Examples of physical processors comprise, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

Although illustrated as separate elements, the method steps described and/or illustrated herein may represent portions of a single application. In addition, in some embodiments one or more of these steps may represent or correspond to one or more software applications or programs that, when executed by a computing device, may cause the computing device to perform one or more tasks, such as the method step.

In addition, one or more of the devices described herein may transform data, physical devices, and/or representations of physical devices from one form to another. For example, one or more of the devices recited herein may receive image data of a sample to be transformed, transform the image data, output a result of the transformation to determine a 3D process, use the result of the transformation to perform the 3D process, and store the result of the transformation to produce an output image of the sample. Additionally or alternatively, one or more of the modules recited herein may transform a processor, volatile memory, non-volatile memory, and/or any other portion of a physical computing device from one form of computing device to another form of computing device by executing on the computing device, storing data on the computing device, and/or otherwise interacting with the computing device.

The term "computer-readable medium," as used herein, generally refers to any form of device, carrier, or medium capable of storing or carrying computer-readable instructions. Examples of computer-readable media comprise, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

A person of ordinary skill in the art will recognize that any process or method disclosed herein can be modified in many ways. The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed.

The various exemplary methods described and/or illustrated herein may also omit one or more of the steps described or illustrated herein or comprise additional steps in addition to those disclosed. Further, a step of any method as disclosed herein can be combined with any one or more steps of any other method as disclosed herein.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and shall have the same meaning as the word "comprising."

The processor as disclosed herein can be configured with instructions to perform any one or more steps of any method as disclosed herein.

As used herein, the term "or" is used inclusively to refer items in the alternative and in combination.

As used herein, characters such as numerals refer to like elements.

Embodiments of the present disclosure have been shown and described as set forth herein and are provided by way of example only. One of ordinary skill in the art will recognize numerous adaptations, changes, variations and substitutions without departing from the scope of the present disclosure. Several alternatives and combinations of the embodiments disclosed herein may be utilized without departing from the scope of the present disclosure and the inventions disclosed herein. Therefore, the scope of the presently disclosed inventions shall be defined solely by the scope of the appended claims and the equivalents thereof.

What is claimed is:

1. A method of team viewing an architectural design model, comprising:

executing team viewing computer-readable instructions to initiate a team viewing process;

attempting to enter a virtual room to allow for more than one user to view a three-dimensional (3D) architectural design model, wherein if the virtual room does not exist, determining if there is a 3D architectural design model open or initiated for display; and if there is no 3D architectural design model open or initiated for display, generating a message to identify that the 3D architectural design model should be open or initiated for display; and blocking the team viewing process until the 3D architectural design model is open or initiated;

joining the virtual room as a guest user;

receiving identification data or parameters regarding the 3D architectural design model;

if a memory device of the guest user computing device already has an electronic copy of the 3D architectural design model, constructing the 3D architectural design model and displaying the 3D architectural design model on a screen of a mobile computing device of the guest user;

if the memory device of the guest user mobile computing device does not have the electronic copy of the 3D architectural design model, downloading the electronic copy of the 3D architectural design model to the memory device of the guest user computing device;

identifying a surface where the 3D architectural design model is to be placed or displayed;

synchronizing with a room creator's mobile computing device and other users' mobile computing devices if other users have joined the virtual room, wherein a room creator created the virtual room;

beginning team viewing of the 3D architectural design model on the mobile computing device of the quest user; and displaying an image of the 3D architectural design model in a virtual environment on a screen of the guest user's mobile computing device, the room creator's mobile computing device and the other users' mobile computing devices if the other users have joined the virtual room.

2. The method of team viewing of claim 1, further comprising:

generating commands to allow a master user or the room creator to control editing or manipulation of the 3D architectural design model in the team viewing process.

3. The method of team viewing of claim 2, further comprising:

receiving an edit or modify command with respect to the 3D architectural design model;

editing or modifying the image of the 3D architectural design model in the virtual environment to create a modified image of the 3D architectural design model in the virtual environment;

capturing a screenshot of the modified image of the 3D architectural design model in the virtual environment;

saving the screenshot of the modified image of the 3D architectural design model in the virtual environment in one or more memory devices of the master user or the room creator's mobile computing device; and communicating the modified image of the 3D architectural design model in the virtual environment to the guest user mobile computing device and the other users' mobile computing devices for display on the screen of the guest user mobile computing device and other users' mobile computing devices.

4. The method of team viewing of claim 2, further comprising:

receiving a command to show a portion of the image of the 3D architectural design model in the virtual environment along a selected plane or dimensional plane;

modifying the image of the 3D architectural design model in the virtual environment to create a modified image of the 3D architectural design model in the virtual environment displaying the 3D architectural design model with respect to the selected plane or the dimensional plane;

capturing a screenshot of the modified image of the 3D architectural design model in the virtual environment along the selected plane or the dimensional plane;

saving the screenshot of the modified image of the 3D architectural design model in the virtual environment in one or more memory devices of the master user's or room creator's mobile computing device; and communicating the modified image of the 3D architectural design model in the virtual environment to other users' mobile computing devices and the guest user's mobile computing device in the virtual room for display on the screens of the guest user's mobile computing device and the other users' mobile computing devices in the virtual room.

5. The method of team viewing of claim 2, further comprising:

receiving a delete or erase command with respect to the image of the 3D architectural design model in the virtual environment;

deleting or erasing sections of the image of the 3D architectural design model in the virtual environment based on the received delete or erase command;

generating a modified image of the 3D architectural design model in the virtual environment with the selected sections erased;

capturing a screenshot of the modified image of the 3D architectural design model in the virtual environment;

saving the screenshot of the modified image of the 3D architectural design model in the virtual environment without the erased or deleted sections in one or more memory devices of the master user's or room creator's mobile computing device; and communicating the modified image of the 3D architectural design model in the virtual environment to the guest user's mobile computing device and other users' mobile computing devices of the virtual room for display on screens of the guest user's mobile computing device and other users' mobile computing device.

6. The method of team viewing of claim 2, further comprising:

receiving an add or enhance command with respect to the virtual environment in which the 3D architectural design model is positioned;

receiving added shapes, notes or lines from the master user or the room creator;

generating a modified image of the 3D architectural design model in the virtual environment including the added shapes, notes or lines;

capturing a screenshot of the modified image of the 3D architectural design model in the virtual environment including the added shapes, notes or lines;

saving the screenshot of the modified image of the 3D architectural design model in the virtual environment including the added shapes, notes or lines in one or more memory devices of the master user's or room creator's mobile computing device; and communicating the modified image of the 3D architectural design model in the virtual environment including the added shapes, notes or lines to the guest user's mobile computing device and other users' mobile computing devices in the virtual room for display on the guest user's mobile computing device and other users' mobile computing devices.

7. The method of team viewing of claim 1, wherein if the virtual room does not exist in an AUGmentecture team viewing software, determining if there is a 3D architectural design model open or initiated for display; and if there is a 3D architectural design model open or initiated for display, creating the virtual room including an input room name to allow beginning of the team viewing of the 3D architectural design model.

8. The method of team viewing of claim 1, further comprising:

generating commands to allow the guest user or other users in the virtual room to control editing, modifying, deleting, erasing or adding to the image of the 3D architectural design model in the virtual environment.

* * * * *